(12) United States Patent
Takeyama et al.

(10) Patent No.: US 6,984,804 B2
(45) Date of Patent: Jan. 10, 2006

(54) NON-CONTACT TREATMENT METHOD

(75) Inventors: Yoshifumi Takeyama, Kyoto (JP);
Tsunenobu Satoi, Yokohama (JP);
Shozo Kasai, Yokohama (JP); Tsutomu Murakami, Nara (JP); Masayuki Kusakari, Tokyo (JP); Koji Tsuzuki, Ikoma (JP); Yoshimitsu Hayashi, Yokohama (JP); Koichi Shimizu, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 1054 days.

(21) Appl. No.: 09/840,893

(22) Filed: Apr. 25, 2001

(65) Prior Publication Data

US 2001/0029976 A1 Oct. 18, 2001

Related U.S. Application Data

(62) Division of application No. 09/219,597, filed on Dec. 23, 1998.

(30) Foreign Application Priority Data

Dec. 26, 1997 (JP) .............................................. 9-359825
Nov. 26, 1998 (JP) ........................................... 10-335077

(51) Int. Cl.
*B23K 26/00* (2006.01)

(52) U.S. Cl. ............................ 219/121.85; 219/121.64; 219/121.69

(58) Field of Classification Search ............ 219/121.85, 219/121.64, 121.69, 121.63, 121.65, 121.66, 219/121.67, 121.68
See application file for complete search history.

(56) References Cited

U.S. PATENT DOCUMENTS

| | | | | |
|---|---|---|---|---|
| 4,023,005 A | * | 5/1977 | Bolin | 219/121.64 |
| 4,296,270 A | | 10/1981 | Köhler | 136/244 |
| 4,340,803 A | | 7/1982 | Coyle | 219/56.22 |
| 4,367,581 A | | 1/1983 | Köhler | 29/572 |
| 4,424,435 A | * | 1/1984 | Barnes, Jr. | 219/121.64 |
| 4,603,089 A | * | 7/1986 | Bampton | 428/593 |
| 4,636,578 A | | 1/1987 | Feinberg | 136/251 |
| 4,697,041 A | | 9/1987 | Okaniwa et al. | 136/244 |
| 4,857,699 A | * | 8/1989 | Duley et al. | 219/121.85 |
| 5,059,254 A | | 10/1991 | Yaba et al. | 136/251 |
| 5,321,227 A | * | 6/1994 | Fuchs et al. | 219/121.68 |
| 5,466,302 A | | 11/1995 | Carey et al. | 136/251 |
| 5,660,646 A | | 8/1997 | Kataoka et al. | 136/251 |
| 5,972,732 A | | 10/1999 | Gee et al. | 438/66 |
| 5,989,757 A | | 11/1999 | Satoi | 430/7 |
| 5,990,413 A | | 11/1999 | Ortabasi | 136/244 |

FOREIGN PATENT DOCUMENTS

| | | |
|---|---|---|
| JP | 30-5639 | 1/1991 |
| JP | 8-139349 | 5/1996 |

\* cited by examiner

*Primary Examiner*—M. Alexandra Elve
(74) *Attorney, Agent, or Firm*—Fitzpatrick, Cella, Harper & Scinto

(57) ABSTRACT

Before electrically connecting at least two photovoltaic elements, a medium capable of absorbing at least 10% or more of a light having a wavelength of 0.4 µm to 2.0 µm is provided on an electric connection portion of the photovoltaic element, whereby the present invention provides a method of electrically connecting a group of photovoltaic elements to one another with a high yield and easy automatization.

14 Claims, 19 Drawing Sheets

PHOTOVOLTAIC ELEMENT 1          PHOTOVOLTAIC ELEMENT 2

PHOTOVOLTAIC ELEMENT 1    PHOTOVOLTAIC ELEMENT 2

PHOTOVOLTAIC ELEMENT 1    PHOTOVOLTAIC ELEMENT 2

PHOTOVOLTAIC ELEMENT 1    PHOTOVOLTAIC ELEMENT 2

PHOTOVOLTAIC ELEMENT 1  PHOTOVOLTAIC ELEMENT 2

PHOTOVOLTAIC ELEMENT 1  PHOTOVOLTAIC ELEMENT 2

PHOTOVOLTAIC ELEMENT 1  PHOTOVOLTAIC ELEMENT 2

MEASUREMENT OF ADHESION STRENGTH OF FILM AFTER WELDING

PHOTOVOLTAIC ELEMENT 1    PHOTOVOLTAIC ELEMENT 2

PHOTOVOLTAIC ELEMENT 1    PHOTOVOLTAIC ELEMENT 2

PHOTOVOLTAIC ELEMENT 1    PHOTOVOLTAIC ELEMENT 2

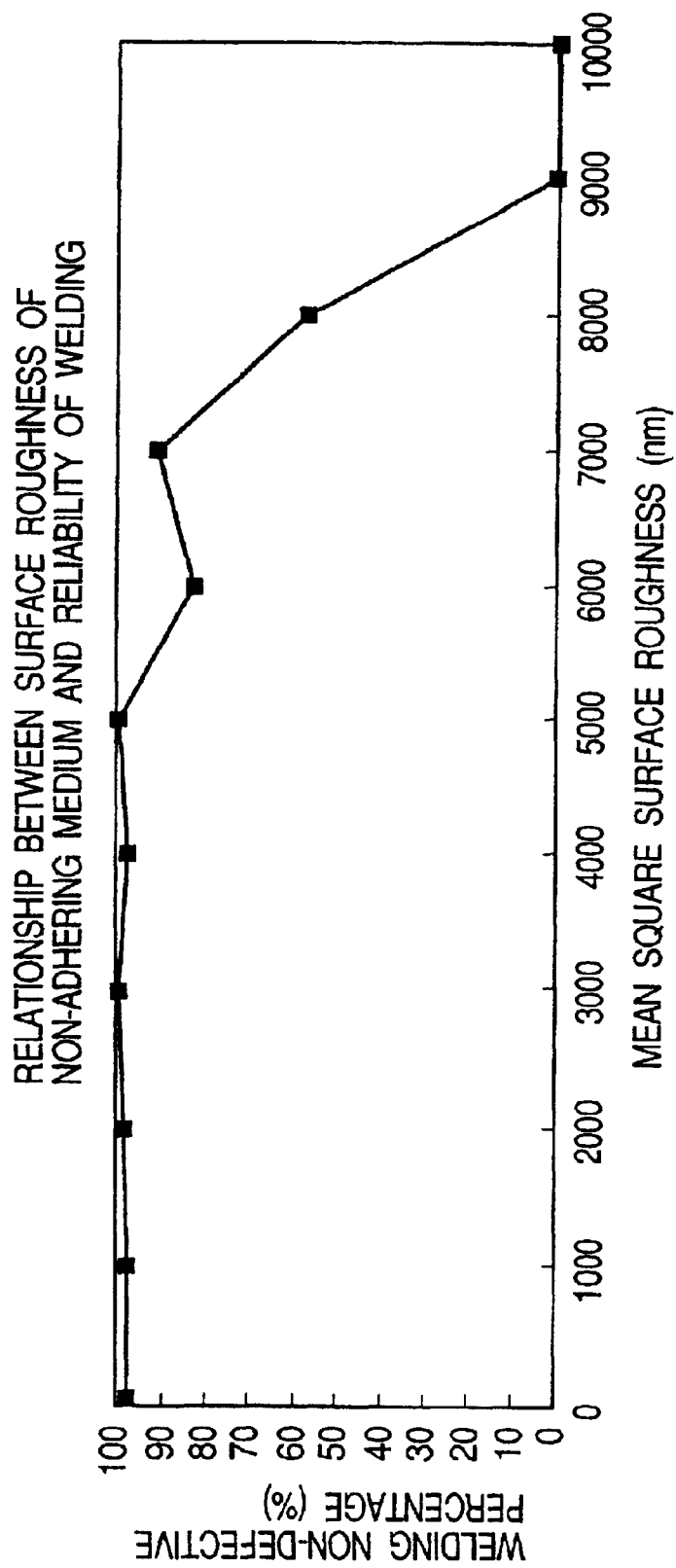

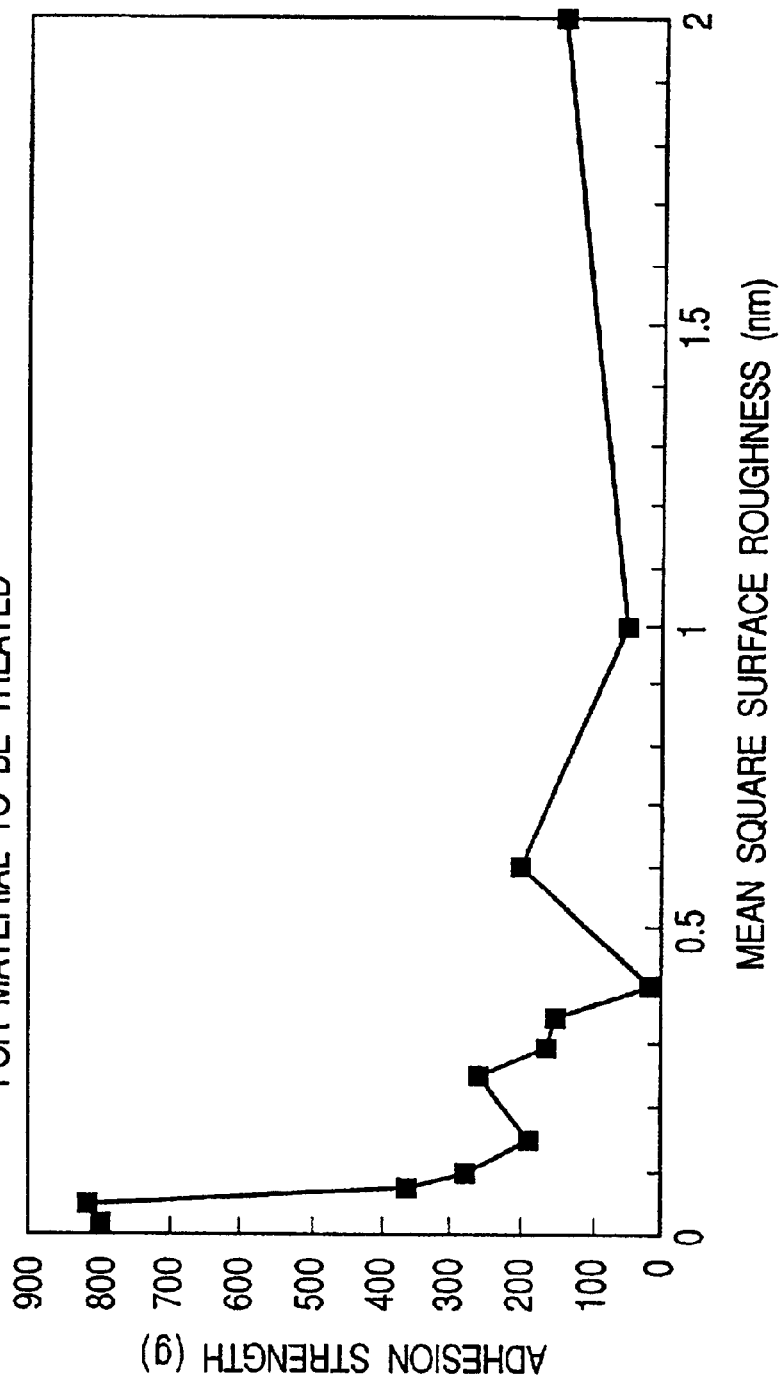

NON-CONTACT TREATMENT METHOD

This application is a division of application Ser. No. 09/219,597, filed on Dec. 23, 1998.

BACKGROUND OF THE INVENTION

1. Field of the Invention

The present invention relates to a photovoltaic element module and its production method, and a non-contact treatment method, and more specifically to a photovoltaic element module comprising a plurality of electrically connected photovoltaic elements and a method of producing this module.

2. Related Background Art

The problem of the escalating global warming caused by the greenhouse effect, that is, an increase in the amount $CO_2$ in the atmosphere, has produced a growing demand for the development of a clean energy source that does not discharge $CO_2$. One of such energy sources is nuclear power. Nuclear power, however, has many problems, such as radioactive wastes, so a safer clean energy source is desired. Of the expected clean energy sources, solar cells (photovoltaic elements) are gathering much attention due to their cleanness, safety, and easy handling.

At present, the solar cells are roughly classified into a crystal type using single-crystal or polycrystal silicon, an amorphous type using amorphous silicon, and a compound semiconductor type. Of these solar cells, the amorphous type is highly expected. That is, despite its conversion efficiency being lower than that of the crystal type solar cell, the amorphous silicon solar cell has excellent characteristics that are absent from the crystal type solar cell. For example, it can operate in the form of a film because the area of the amorphous type solar cell can be easily increased. Also, it has a large photoabsorption coefficient.

One of the reasons for a slow dissemination of solar cells, despite the attention they have drawn, is their high cost. Various methods have been examined to reduce the production costs of solar cells. The representative approaches include:

(1) Reduction of the production costs of a photoelectric conversion layer, (2) Efficient utilization of an electric power generating region, (3) Reduction of the number of connections, reducing connection material and labor costs, and (4) Reduction of the use amount of covering materials and the material costs.

Of these approaches, the present invention particularly relates to the above point (3). The solar cell connection step is complicated and requires high reliability. However, for simplification and cost reduction, as well as the reduction of the number of parts, an automated mass-production connection method and high speed treatment are required.

FIGS. 11A and 11B are schematic views showing an example of a photovoltaic element which is disclosed in, for example, Japanese Patent Application Laid-Open No. 8-139349 and which has been investigated by the inventors. FIG. 11A is a plan view of the photovoltaic element as seen from its light-receiving surface side, and FIG. 11B is a sectional view of the photovoltaic element shown in FIG. 11A, which is taken along the line 11B—11B in FIG. 11A.

A photovoltaic element 600 shown in FIG. 11, is produced by sequentially stacking a lower electrode layer 603, a semiconductor layer 604, and an upper electrode layer 605 on a conductive substrate 602 of, for example, stainless steel.

The upper electrode layer 605 comprises a transparent conductive film such as of indium oxide or indium tin oxide (ITO) and operates as both a reflection-preventing means and a current-collecting means.

A part of the transparent conductive film is linearly removed at a portion as shown by 601 (an etching line) in FIG. 11A by using screen printing or other methods of applying etching paste containing $FeCl_3$ or $AlCl_3$ to the film and heating it. A part of the transparent electrode film is removed in order to prevent a short circuit from occurring between the substrate 602 and the upper electrode layer 605 when the outer circumference of the photovoltaic element is cut.

In addition, a current-collecting electrode 606 is formed on the surface of the upper electrode layer 605 to efficiently collect generated power. The current-collecting electrode 606 is formed by adhering a metal wire coated with the thin layer of a conductive adhesive (for example, a copper wire coated with a carbon paste) to the upper electrode layer 605 in order to obtain electric power generated in the semiconductor 15 layer without loss. The copper wire is used in order to reduce power loss, and may be replaced by another highly conductive material.

Furthermore, a conductive foil 607 is provided as a further current-collecting electrode in addition to the current-collecting electrode 606. An insulating member 608 is provided under the conductive foil 607 to ensure the insulation provided by the etching line portion, the performance of which cannot be guaranteed.

In the photovoltaic element 600, the metal foil 607 and the substrate 602 function, respectively, as terminals of a positive and a negative electrodes to provide electric power.

It is difficult, however, for this photovoltaic element to be directly used for electric power generation. Since the single photovoltaic element normally generates excessively low power, a plurality of photovoltaic elements must be connected in series or parallel to provide a desired voltage and current. FIG. 11C is a plan view showing an example of series-connected photovoltaic elements (in the case of two series). In this figure, the conductive foil 607 of one photovoltaic element is electrically connected in series to the substrate 602 of another adjacent photovoltaic element by using a connection member 611. Solder is used for the connection and the series connection is completed by carrying out cleaning with a solvent such as MEK (methylethylketone) after soldering.

The conventional method of connecting photovoltaic elements to each other, however, has the following problems.

(1) To fix the conductive foil to the metal substrate by using solder, a part of the substrate must be heated to melt and fix the solder. The heat, however, is transferred through the thermally conductive metal substrate and the semiconductor layer may degrade over a wide area worsening specific characteristics. In addition, defects may occur in the semiconductor layer depending on the heating temperature or time, thereby reducing the yield.

(2) The heat for melting and fixing the solder may degrade the conductive adhesive provided on the semiconductor element to reduce the adhesion strength and electric conductivity, thereby reducing reliability.

(3) Since the solder must be melted, at least about ten seconds are required to heat and cool it, thereby negatively affecting mass-productivity.

(4) If an automatic machine is used for mass production, it is difficult to control the temperature to achieve uniform soldering and to control the tip of a soldering iron. Thus, automation is difficult.

(5) Even when the solvent, such as MEK, is used to wipe off the excess solder, fluxes adhering to the substrate cannot be easily removed to cause rust under high-temperature and high-humidity conditions. Consequently, the covering material of the solar cell may be peeled off.

(6) Using a soldering iron for connections may produce solder residue to reduce the yield. For example, the solder residue may penetrate between the adjacent photovoltaic elements connected in series to cause a short circuit therebetween.

On the other hand, the non-contact treatment method utilizing radiation of laser light, halogen light or electromagnetic waves is widely used in the processing treatment for materials, such as etching, welding or cutting, or in thermal treatment for semiconductor materials. Such a method can more or less solve the problems of the connections using solder.

It is important for the non-contact treatment, however, to efficiently absorb light, heat, or electromagnetic waves. When, for example, a material such as gold, silver, copper, or aluminum is used which are frequently used for electrodes for electric parts, in particular, photovoltaic elements, these materials have a high surface reflectance with respect to the laser light and therefore exhibit a lower efficiency of absorbing energy. Thus, the idea for improving the absorption efficiency of energy is required. Also, a method of improving the absorption efficiency of energy is required that can increase the efficiency of energy absorption without the need for additional steps and that enables stable and high speed treatment.

SUMMARY OF THE INVENTION

It is an object of the present invention to solve the above problems in order to provide a photovoltaic element connection method that is reliable and easy to automate.

It is another object of the present invention to provide a photovoltaic element connection method and a laser treatment method that enables stable and high speed treatment and that utilizes an energy-absorbing medium, and after treatment, the medium does not remain on the treated surface.

The present invention solves the above problems to achieve the above objects. The present invention provides a photovoltaic element module comprising at least two photovoltaic elements electrically connected to each other, wherein a medium capable of absorbing at least 10% or more of a light having a wavelength of 0.4 $\mu$m to 2.0 $\mu$m is provided on an electric connection portion of the photovoltaic element.

In addition, the present invention provides a method of producing a photovoltaic module, which comprises electrically connecting at least two photovoltaic elements to each other, wherein a medium capable of absorbing at least 10% or more of a light having a wavelength of 0.4 $\mu$m to 2.0 $\mu$m is provided on a part of a first photovoltaic element, and then irradiating the medium with the laser beam at a wavelength of 0.4 $\mu$m to 2.0 $\mu$m to electrically connect the first and second photovoltaic elements to each other.

Furthermore, the present invention provides a method of producing a photovoltaic module, which comprises electrically connecting at least two photovoltaic elements to each other, wherein each of the photovoltaic element has at least a conductive substrate, a semiconductor layer, and a light-transmissive electrode, and wherein electrically connecting the conductive substrate of a first photovoltaic element and the light-transmissive electrode of a second photovoltaic element to each other is done by laser welding.

Moreover, the present invention provides a non-contact treatment method of carrying out treatment by using an energy supply means for applying energy, which comprises placing a non-adhering medium capable of absorbing the energy on a material to be treated and irradiating the non-adhering medium with energy.

Moreover, the present invention provides a method of producing a photovoltaic module, which comprises electrically connecting at least two photovoltaic elements to each other, wherein a non-adhering medium capable of absorbing the energy is placed on a part of a first photovoltaic element and the medium is irradiated with energy to electrically connect the first photovoltaic element and a second photovoltaic element to each other.

BRIEF DESCRIPTION OF THE DRAWINGS

FIG. 1A is a plan view of the photovoltaic element as seen from its light-receiving surface side, and FIG. 1B is a sectional view of the photovoltaic element shown in FIG. 1A, which is taken along the line 1B—1B in FIG. 1A;

FIG. 3A is a plan view of the photovoltaic element as seen from its light-receiving surface side, and FIG. 3B is a sectional view of the photovoltaic element shown in FIG. 3A, which is taken along the line 3B—3B in FIG. 3A;

FIG. 5A is a plan view of the photovoltaic element as seen from its light-receiving surface side, and FIG. 5B is a sectional view of the photovoltaic element shown in FIG. 5A, which is taken along the line 5B—5B in FIG. 7A;

FIG. 7A is a plan view of the photovoltaic element as seen from its light-receiving surface side, and FIG. 7B is a sectional view of the photovoltaic element shown in FIG. 7A, which is taken along the line 7B—7B in FIG. 7A;

FIG. 9A is a plan view of the photovoltaic element as seen from its light-receiving surface side, and FIG. 9B is a sectional view of the photovoltaic element shown in FIG. 9A, which is taken along the line 9B—9B in FIG. 9A;

FIG. 11A is a plan view of the photovoltaic element as seen from its light-receiving surface side, FIG. 11B is a sectional view of the photovoltaic element shown in FIG. 11A, which is taken along the line 11B—11B in FIG. 11A, and FIG. 11C is a plan view of two series-connected photovoltaic elements as seen from their light-receiving surface side;

FIG. 18A is a plan view of the photovoltaic element as seen from its light-receiving surface side, and FIG. 18B is a sectional view of the photovoltaic element shown in FIG. 18A, which is taken along the line 18B—18B in FIG. 18A;

FIG. 21 is a graph showing the relationship between the mean square surface roughness of the non-contact medium and its welding reliability; and FIG. 22 is a graph showing the relationship between the mean square surface roughness of the non-contact medium and its adhesion strength to a treated material.

DESCRIPTION OF THE PREFERRED EMBODIMENTS

Figure 12:
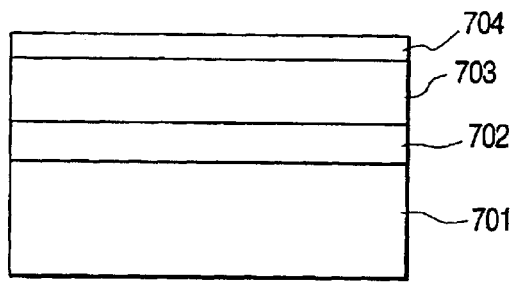
FIG. 12 is a sectional view schematically showing a configuration of the photovoltaic element.

Preferred embodiments of the present invention are described below with reference to the drawings.
Photovoltaic Element FIG. 12 schematically shows a sectional view of an example of a photovoltaic element used in the present invention. In this figure, numeral 701 indicates a substrate, 702 a lower electrode layer, 703 a semiconductor layer, and 704 an upper electrode layer. The photovoltaic element shown in FIG. 12 can be applied to an amorphous silicon type solar cell, which is, preferably, flexible. Such a configuration, however, can be applied to solar cells other than the amorphous type solar cells, such as a single crystalline or polycrystalline solar cell, or a solar cell using a semiconductor other than silicon or having the Schottky junction.

The substrate 701 is a member for mechanically supporting the semiconductor layer 703 in a thin solar cell of amorphous silicon type. The material for the substrate 701 may be conductive or insulating but must be conductive when the substrate 701 also acts as an electrode. The substrate 701 must be durable enough to withstand the heating temperature for forming the semiconductor layer 703.

The conductive material for the substrate 701 includes metals such as Fe, Ni, Cr, Al, Mo, Au, Nb, Ta, V, Ti, Pt, and Pb; and alloys thereof, for example, a sheet metal such as brass or stainless steel; and composites thereof.

The electrically insulating material for the substrate 701 includes heat-resistant synthetic resins, such as polyester, polyethylene, polycarbonate, cellulose acetate, polypropylene, polyvinyl chloride, polyvinylidene chloride, polystyrene, polyamide, polyimide, and epoxy resin; and their composites with glass, carbon, boron, or metal fibers; glass; and ceramics.
Lower Electrode Layer The lower electrode layer 702 is one of the electrodes for collecting electric power generated in the semiconductor layer 703 and must function in such a way that the lower electrode layer 702 forms an ohmic contact with a semiconductor.

The material for the lower electrode layer 702 includes metals such as Al, Ag, Pt, Au, Ni, Ti, Mo, Fe, V, Cr, Cu, stainless steel, brass, nichrome, $SnO_2$, $In_2O_3$, ZnO, and ITO (indium tin oxide); and alloys thereof; and transparent conductive oxide (TCO).

The surface of the lower electrode layer 702 is preferably smooth, but may be textured when it irregularly reflects light. In addition, when the substrate 701 is conductive, the lower electrode layer 702 may be omitted.

The lower electrode layer 702 may be provided by a well-known method, such as plating, deposition, or sputtering.
Semiconductor Layer The semiconductor layer 703 of the photovoltaic element used in the present invention comprises a well-known semiconductor material generally used for thin film solar cells. Specifically, it is possible to use as the semiconductor layer 703, a pin-junction amorphous silicon layer, a pn-junction polycrystalline silicon layer, or a layer of a compound semiconductor such as $CuInSe_2$/CdS.

When the semiconductor layer 703 is an amorphous silicon layer, it can be formed by introducing a raw material gas, such as silane gas for forming a film, into a plasma CVD apparatus for generating plasma discharge. In addition, when the semiconductor layer 703 is a pn-junction polycrystalline silicon layer, it can be formed by forming a film using molten silicon. When the semiconductor layer 703 consists of a compound semiconductor such as $CuInSe_2$/CdS, it can be formed by the electron beam deposition method, the sputtering method, or the electrodepositon method.

Upper Electrode Layer

The upper electrode layer 704 is one of the electrodes for collecting the electromotive force generated in the semiconductor layer 703 and is paired with the lower electrode layer 702. Like the lower electrode layer 702, the upper electrode layer 704 must function in such a way that the layer 704 forms an ohmic contact with a semiconductor. The upper electrode layer 704 is required when the semiconductor layer 703 comprises a semiconductor such as amorphous silicon having a high sheet resistance, and is not particularly required when a crystalline semiconductor is used, due to its low sheet resistance.

When the substrate 701 is opaque, the upper electrode layer 704 is necessarily located on the light incident side. In this case, the upper electrode layer 704 must transmit light, that is, must be a transparent electrode. To allow light from the sun or a white fluorescent lamp to be efficiently absorbed by the semiconductor layer 703, the light transmittance of the upper electrode layer 704 is preferably 85% or more. In addition, to allow a photoelectric current generated in the semiconductor layer 703 to efficiently flow in a direction parallel to the semiconductor layer 703, the sheet resistance of the upper electrode layer 704 is preferably 100Ω/□ or less. The material having these characteristics and preferred for the upper electrode layer includes metal oxides such as $SnO_2$, $In_2O_3$, ZnO, CdO, $CdSnO_4$, and ITO ($In_2O_3+SnO_2$).

Non-contact Treatment and Method of Producing Photovoltaic Element Module

The non-contact treatment according to the present invention can be applied to welding or cutting of various parts, including electric parts or general structures formed of either a metal material or a nonmetal material by energy irradiation, to etching or patterning during a step of producing an electric-part, and to the thermal treatment of semiconductor materials.

In the present invention, laser welding is applied particularly to photovoltaic elements. The energy supply means used in the present invention and the medium capable of absorbing energy are described below and are the features of the photovoltaic element module according to the present invention.

Energy Supply Means

As the energy supply means according to the present invention, light, heat or electromagnetic waves can be suitably used. Heating by irradiation of light, such as laser light, a halogen lamp or a far infrared lamp, can be used.

The laser used for laser welding according to the present invention includes a solid laser, such as ruby ($Cr^{3+}$: $Al_2O_3$), YAG ($Nd^{3+}$: $Y_3Al_5O_{12}$), phosphate glass, silicate glass, YLF ($Nd^{3+}$: $LiYF_4$), or Thailand sapphire ($Ti^{3+}$: $Al_2O_3$), and a gas laser such as $CO_2$-laser-excited or discharge-excited far infrared radiation or rare gas ions.

Figure 13:
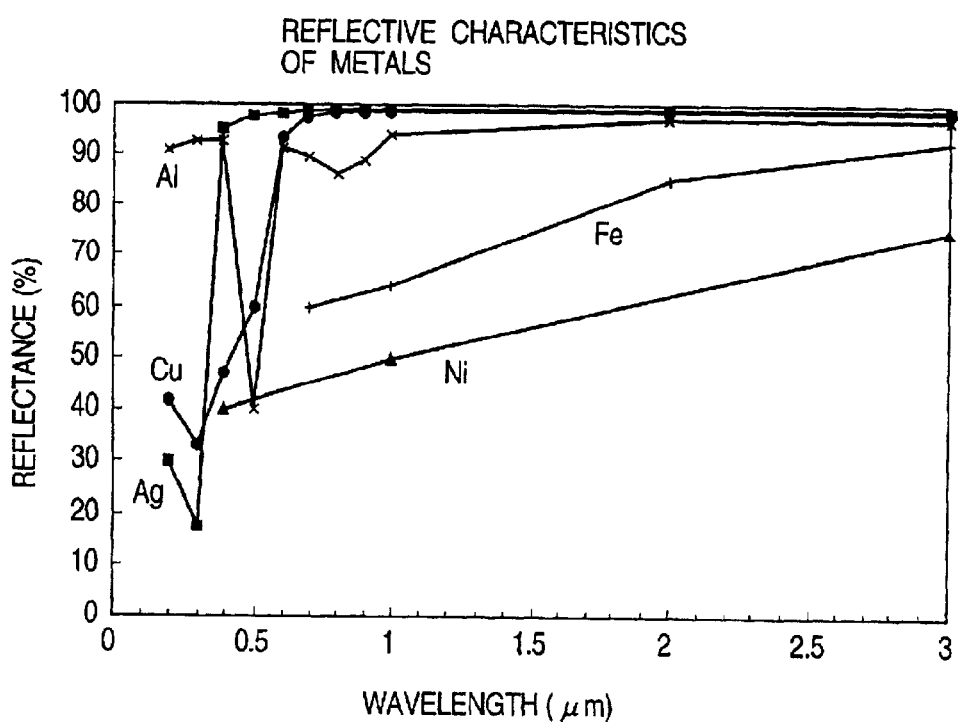
FIG. 13 is a graph showing the reflective characteristics of metals.

The metal material used for a system, such as a solar cell, which has a large current flow, preferably has a low resistance in order to reduce losses caused by the resistance. As shown in FIG. 13, however, the reflectance is relatively high when the metal is irradiated with light having a wavelength of 0.4 µm or more. Thus, it has been difficult to weld metal with laser light having a wavelength of 0.4 µm or more. On the other hand, the use of laser light of less than 0.4 µm increases costs, for example, for excimer lasers. Accordingly, the use of laser light having a wavelength of not more than 0.4 µm has been limited to expensive high-value products.

The present invention allows the use of laser light having a wavelength of 0.4 µm or more to weld metal.

Of the lasers having a wavelength of 0.4 µm or more, solid lasers (the wavelength of main solid lasers is in a range of 0.4 µm to 2.0 um) are more efficient than gas lasers and have the advantages of being more compact and providing higher-power laser light. In particular, YAG lasers have excellent characteristics, such as their capabilities of transmitting laser light through optical fibers and executing welding at a position remote from a laser transmitter. They also enable the welding conditions to be changed by the selection of optical fibers and outgoing units and also enable one laser beam to be divided into about 2 to about 10 beams.

Medium Capable of Absorbing Energy

The reflectivity obtained when a metal is irradiated with light depends on the type of metal, and is shown in FIG. 13. Despite the amount of reflection depending on the wavelength, most irradiation light is reflected particularly at the long wavelength side. For example, at 0.7 µm, which is close to the wavelength of ruby laser beams (0.69 µm), the reflectances of gold, silver, copper, and aluminum are 97.0%, 98.5%, 97.5%, and 89.8%, respectively. The reflectances at the YAG laser wavelength (1.06 µm) of gold, silver, copper, and aluminum are 98.2%, 98.9%, 98.5%, and 93.9%, respectively. Thus, it has been difficult to weld metal such as gold, silver, copper, and aluminum used for photovoltaic elements, by using the ruby or YAG laser.

Medium capable of absorbing at least 10% or more of laser light having wavelength of 0.4 µm to 2.0 µm Thus, in the present invention, a medium capable of absorbing 10% or more of laser light is provided on a surface to be welded to reduce inappropriate welding while enabling stable laser welding. In particular, the medium preferably has an absorptivity of 10% or more at 0.4 µm to 2.0 µm, which is in the wavelength range of the above solid laser.

Figure 14:
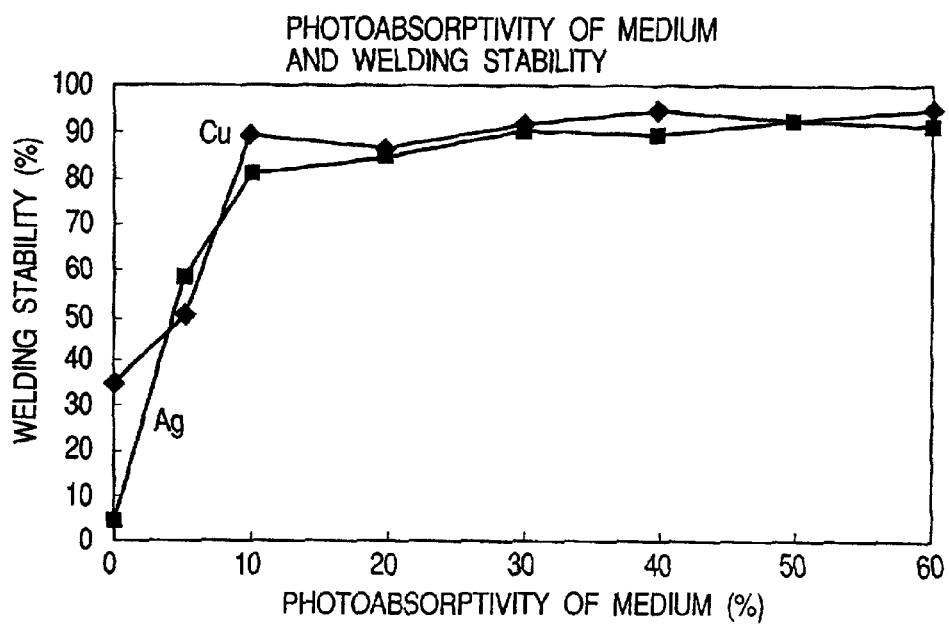
FIG. 14 is a graph showing the relationship between the photoabsorptivity of a medium and the welding stability.

FIG. 14 shows the effects obtained by providing a medium capable of absorbing 10% or more of laser light on a surface to be welded.

FIG. 14 is a graph showing the relationship between the photoabsorptivity of the medium and welding stability obtained when a copper foil and a silver-plated copper foil (each having a thickness of 100 µm) having a high reflectance were selected as a metal to be irradiated with laser light and when paint was applied uniformly to the surface of the metal as the medium, followed by the irradiation of YAG laser beams (wavelength: 1.06 µm) to carry out welding. A plurality of paints having different photoabsorptivities were used for evaluations. In addition, welding was carried out under conditions optimal for each reflectance (however, copper and silver-plated copper were welded under the same conditions). Furthermore, in evaluating the welding stability, a sample after welding that exhibited a joining force of 4.0 kg or more after thermal cycle tests (200 cycles at 90° C. to −40° C.) and in which no holes or cracks were found in the welded portion when observed using an optical microscope, was regarded as a good product (non-defective product). Thus, all the obtained samples were evaluated based on the non-defective percentage.

Since copper and silver reflect 98.0% or more of laser light having a wavelength of 1.06 µm, the welding stability of the metal is normally 40% or less. Thus, it is difficult to subject them to laser welding. As shown in FIG. 14, however, by providing a medium capable of absorbing light on the surface of the metal, it is possible to improve the welding stability of the metal. In particular, the welding stability is 80% or more when the medium has a photoabsorptivity of 10% or more.

The energy (welding energy) required for welding a metal by using laser light can be represented by the following equation.

(Welding energy)=(laser outgoing energy)×(photoabsorptivity of metal)

Normally, when a metal is welded using laser light, laser light having a larger energy than the welding energy must be supplied in consideration of the surface reflection of the metal. If, for example, the metal has a light reflectance of 90%, it is necessary to irradiate the metal with light having a laser outgoing energy which is 10 times as large as that required for metal with no reflection. Once laser light is introduced into the metal, the metal melts and readily absorbs laser light. Consequently, most of the energy supplied is used for welding. When, however, the metal is, for example, a thin foil used for a photovoltaic element, excessive energy may increase the temperature of the irradiated portion above the melting point of the metal, resulting in holes in the metal. In the present invention, a medium capable of absorbing laser light having a wavelength of 0.4 $\mu$m to 2.0 $\mu$m is provided on the surface of a metal to be irradiated with laser light to restrain the reflection from the surface of the metal and allow laser light to be easily introduced into the metal. For example, in the case of executing welding that requires 5J, 50J outgoing energy is required when the reflectance of the metal is 90%, whereas it is possible to execute welding with 25I outgoing energy when the reflectance of the surface can be reduced to 80% by using a medium. That is, by providing a light-absorbing medium on the surface of metal having high surface reflection, the outgoing energy of laser light can be considerably reduced. This configuration can prevent holes from being formed in the metal.

Although the above discussion mentions the use of paints as the medium capable of absorbing light, the medium according to the present invention is not limited to paints and may be appropriately selected regardless of whether the materials are insulating or conducting. The insulating material used for the medium according to the present invention, however, must melt when heated during welding to maintain the conductivity between the metal members.

Specifically, the object of the present invention can be sufficiently achieved by coloring the surface of the metal member using felt pen or ink jet. The color is preferably other than white to provide a larger photoabsorption coefficient. To improve the welding stability, an ink application method that enables ink to be uniformly applied is preferably used. Various methods can be used, such as, for example, the hardening of a silk-screen-printed ink by using a hot air drying furnace.

In addition, instead of using an ink, a film material such as a black PET polyethyleneterephthalate) film (for example, trade name: LUMIRROR X30, produced by Toray Industries, Inc.; and trade name: MELINEX 427, produced by ICI Japan Ltd.) may be stuck to the surface of the metal member, and the metal member may be welded together with the film by irradiating it with laser light from the film side. After welding, the film is preferably removed, but may not be removed depending on the material of the film. When the thickness of the film is in a range of 5 $\mu$m to 30 $\mu$m, welding is stabilized to allow the film to be removed easily after welding.

Furthermore, when a conductive material is used as the medium, a metal material of a large photoabsorption coefficient may be selectively used. Specifically, an iron based material, such as stainless steel, a material plated with Ni or solder, a material obtained by treating in a strong-acid solution to oxidize or etch the surface of a metal, a material coated with carbon black, or a material with conductive fine particles dispersed therein may be located on the surface of the metal member, which is then welded together with the conductive material. After welding, the conductive material is preferably removed, but may not be removed depending on the material.

The metal member may be plated with Ni or solder to use the Ni or solder as the medium capable of absorbing light.

Figure 15:
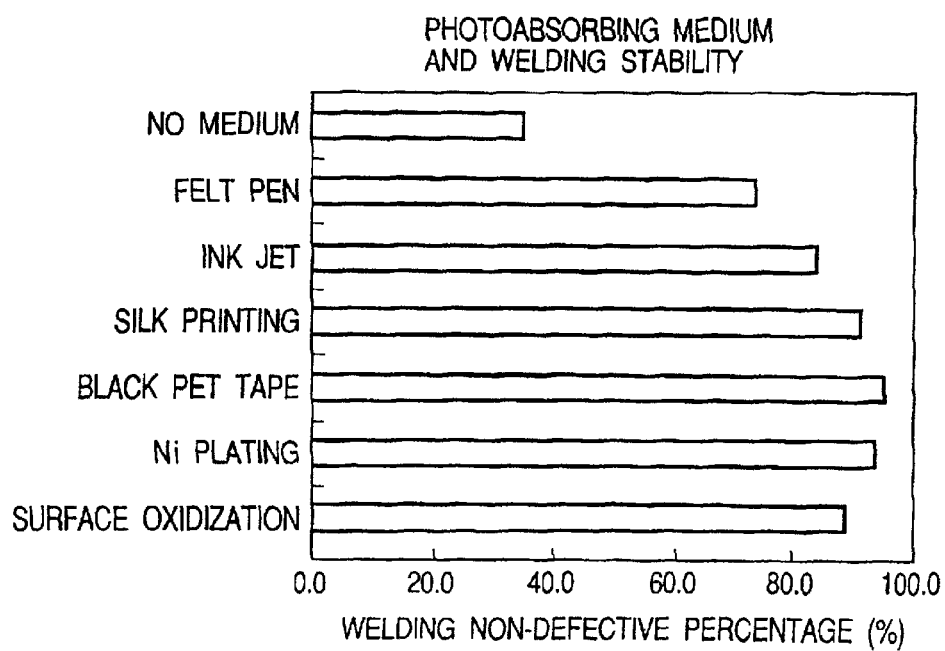
FIG. 15 is a graph showing the welding stability of a light-absorbing medium.

FIG. 15 shows examples of welding stability, which were obtained when the above-mentioned media and YAG laser were used to carry out welding. The details of the media shown in FIG. 15 are as follows.

| Felt pen: | Oily Magic Ink No. 500 |
| | Manual application |
| | Photoabsorptivity: 10% |
| Silk screen printing: | Emerson & Cuming CT-5079-3A (produced by National Starch & Chemical Company) |
| Felt pen: | Oily Magic Ink No. 500 |
| | Printer |
| | Photoabsorptivity: 60% |
| Ink jet printer: | JP-K27 (produced by Hitachi Manufacturing Company) |
| | Dedicated printer |
| | Photoabsorptivity: 25% |
| Black PET tape: | MELINEX 427 (produced by ICI Japan Ltd.) |
| (LUMIRROR X (produced by Toray Industries, Inc.) or black-treated LUMIRROR T (produced by Toray Industries, Inc.) | |
| | Photoabsorptivity: 60% |
| Ni plating: | Thickness: 2 $\mu$m to 5 $\mu$m |
| | Photoabsorptivity: 50% |
| Surface oxidation: | Electrolytic treatment |
| | Photoabsorptivity: 20% |

All the media provided satisfactory results, that is, their welding stabilities were 70% or more.

Non-adhering Medium

The following materials are applicable as the non-adhering medium according to the present invention.

The applicable materials include paper; cloth; leather; thin metal foils, such as stainless steel, steel and black alumite; polyester films, such as a polyethyleneterephthalate film, a polybutylene-terephthalate film, a polyethylenenaphthalate film, a polycyclohexylenedimethyleneterephthalate film, and a polyethylenebisphenoxycarboxylate film; polyolefin films, such as a polyethylene film and a polypropylene film; a cellulose derivative film, such as a cellulose acetate butylate film and a cellulose acetate propionate film; vinyl resin films, such as a polyvinyl chloride film and a polyvinylidene chloride film; polymer films, such as a polystyrene film, a polyamide film, a polyimide film, a polycarbonate film, a polysulfone film, a polyurethane resin film, an epoxy resin film, and a fluoride resin film; and a composite material comprising the above polymer film laminated with a thin metal foil, such as a stainless steel, foil, a steel foil, or a black alumite foil.

When the medium has at least the polymer film among the above materials, the polymer film is thin and strong and can be removed easily after welding because the polymer film melts and evaporates during energy irradiation. In addition, the polymer films supplied on the market are long, so that high-volume welding can be carried out.

The objects of the present invention are best accomplished when the medium is a magnetic tape. This is because this material is excellent in workability, mold-releasing capability, and high-speed treatment. The mold-releasing capability can be further improved by attaching the magnetic surface of the magnetic tape to a material to be treated.

Furthermore, the surface of the non-adhering medium that attaches to a material to be treated preferably has a surface roughness of 0.1 nm to 5,000 nm. When the roughness is 5,000 nm or less, the non-adhering medium efficiently guides, for example, laser light to the material to be treated as shown in FIG. 21. When the surface of the non-adhering medium that is attached to the material to be treated has a surface roughness of 0.1 nm or more in mean square, the non-adhering medium is unlikely to stick to the treated material during laser treatment as shown, for example, in FIG. 22. This allows the non-adhering medium to be easily removed after laser treatment.

The methods of providing on at least a side of the medium that contacts the material to be treated by energy irradiation, recessed and protruding portions corresponding to a surface roughness of 0.1 to 5,000 nm in mean square, include the use of the characteristics of the material itself in relation to the medium, the surface treatment by etching or discharge, the deformation of the surface shape by pressing or scratching, the mixing of a carbon block or a color material, such as pigment, into the polymer film, or the application or deposition of a selected material.

As one example of using the polyethyleneterephthalate film, the protrusions on the surface of the polyethyleneterephthalate film can be controlled by the selection of a polymerization medium for a raw polymer material or by adding inorganic particles to the film, as disclosed in Japanese Patent Publication No. 30-5639. More specifically, there is a method of adding an oxide, such as $SiO_2$, $TiO_2$, $CaCO_3$, or $Al_2O_3$ or an inorganic salt, during the polymerization of the raw material polymer or during the melting of pellets prior to drawing.

In addition, material that are applied or deposited onto the medium include carbon black, graphite, titanium oxide, barium sulfate, zinc sulfide, magnesium carbonate, calcium carbonate, zinc oxide, calcium oxide, magnesium oxide, tungsten disulfide, molybdenum disulfide, boron nitride, tin disulfide, silicon disulfide, chromium oxide, alumina, silicon carbide, cerium oxide, corundum, artificial diamond, iron oxide, garnet, silica rock, silicon nitride, molybdenum carbide, boron carbide, tungsten carbide, titanium carbide, diatomaceous earth, dolomite, a lubricant such as a resin powder, an abrasive, an anti-static agent, a dispersant, and a pigment. Also, dyes that may be combined with the above materials can be used. For example, applicable dyes include a phthalocyanine dye, an azo dye, an anthraquinone dye, an indigoido dye, a nitro and nitroso dyes, a quinoline dye, a methyne dye, a thiazole dye, a quinoneimine dye, an azine dye, an oxazine dye, an thiazine dye, an azoic dye, a diphenylmethane dye, a triphenylmethane dye, a xanthene dye, acridine dye, an oxidation dye, a sulfidization dye, a phthalein dye, an aminoketone dye, or an oxyketone dye.

Paper, cloth, or a material coated with a pigment by a nozzle coater, such as carbon black, is preferably used as a non-adhering anti-reflection medium because "residue" resulting from heat during laser treatment is unlikely to stick to the treated material.

The means for supplying the non-adhering medium is not particularly limited and may handle a sheet medium or a roll medium. However, the medium can be preferably attached and detached to such means and, preferably, continuously supplied to facilitate mass production.

When a sheet-like medium is supplied, it may have to be replaced at the end of each treatment or a means may be required for offsetting a position so as to avoid irradiating the same position with energy. Thus, the medium is preferably supplied from the form of a roll and is desirably wound up after treatment. When the medium is shaped like a roll, it can be continuously supplied by using a simple delivery and winding mechanisms, thereby enabling mass production.

Material to be Treated

The material to be treated may be selected from various metal materials or non-metal materials, and is not limited. The present invention, however, is particularly effective for a material having low absorption with respect to the energy used for treatment. Specifically, the present invention is effective for a high-reflection material reflecting at least 40% or transmitting at least 40% of the energy used for treatment.

Specific metal materials that can be used include Fe, Ni, Cr, Al, Mo, Au, Nb, Ta, V, Ti, Pt, Pb, Ag, or Cu, or an alloy thereof, for example, stainless steel, brass, or nichrome. In particular, as a metal material used for an electrode in an electric part through which a current flows, materials such as gold, silver, copper, or aluminum are preferably used because they have low resistance, thereby reducing losses due to resistance. Laser light, however, is noticeably reflected from the above metals, as described above (FIG. 13). It has been difficult to directly irradiate these metals with laser light having a wavelength of 0.4 µm or more. Laser light having a wavelength of less than 0.4 µm requires expensive equipment, such as excimer lasers, and is unlikely to supply sufficiently amount of energy required for welding or cutting. Consequently, the application of such laser light has been limited.

In addition, as the non-metal material to be treated, it is possible to use a synthetic resin such as polyester, polyethylene, polycarbonate, cellulose acetate, polypropylene, polyvinyl chloride, polyvinylidene chloride, polystyrene, polyamide, polyimide, an epoxy resin, or a fluororesin. Glass fibers, carbon fibers, or boron fibers, and glass or ceramics may also be used.

Materials to be removed or the semiconductor materials to be thermally treated by laser light during etching or patterning in the step of producing an electric part include single-crystalline silicon, polycrystalline silicon, amorphous silicon, a silicon-containing compound, such as $CuInSe_2$/CdS, and $SnO_2$, $In_2O_3$, ZnO, or ITO (indium tin oxide).

The connection method according to the present invention has been accomplished by the inventors conducting experiments and detailed investigations in order to devise a method that is reliable and can be easily automated to produce a photovoltaic element module by electrically connecting at least two photovoltaic elements in series or in parallel. This method has the following effects.

(1) Since operations are completed faster than by conventional techniques and a welding point has the smallest area, the present invention has fewer portions adversely affected by heat. Thus, the present invention allows to achieve almost all specific characteristics of the semiconductor. A further improvement may be accomplished by separating a portion where welding is carried out by laser from effective areas via etching lines.

(2) In connecting photovoltaic elements, each comprising a semiconductor element provided on the metal substrate, the metal substrate separated from the effective areas via etching lines can be directly used as an output terminal electrode, thereby omitting the step of forming a terminal to reduce the non-electric power-generation area. This also applies to conductive substrates other than metal substrates.

(3) In electrically connecting adjacent photovoltaic elements to each other, a metal member is provided on the electrode portion of the semiconductor element and the metal members of the photovoltaic elements are electrically connected to each other by laser welding. Therefore, the semiconductor is almost not affected by the adverse effect of heat, thereby avoiding restrictions on the form of connection to enable arbitrary designs.

(4) A conductive adhesive can be used to join the semiconductor layer and collecting electrode of the photovoltaic element and to join the collecting electrode of the photovoltaic element and the metal member provided on the electrode portion for simplification. In the conventional techniques using solder, heating for melting and fixing solder causes the conductive adhesive to degrade, reducing the yield. The present invention, however, solves this problem, allowing the conductive adhesive to be used to produce a photovoltaic element module.

(5) When the metal members are welded together by laser light, the metal material has reflective characteristics such as those shown in FIG. 13. Therefore, the energy of the laser light must be higher than is actually required for welding due to the surface reflection losses of the metal. However, once laser light is introduced into the metal, the metal melts and readily absorbs laser light, thereby changing most of the supplied energy to welding energy. In this case, when the metal member is, for example, a thin foil used for a thin photovoltaic element, an excessive amount of energy raises the temperature of the portion irradiated with laser light above the boiling point of the metal, causing holes to form in the metal member. In the present invention, a medium capable of absorbing 10% or more of laser light having a wavelength of 0.4 $\mu$m to 2.0 $\mu$m is provided on the surface of the metal member to restrain the reflection from the surface of the metal member in order to allow laser light to be easily introduced into the metal member. This configuration can reduce the outgoing energy of the laser to simplify the welding of metal with a high surface reflectance, and stabilize the welding strength, thereby providing a reliable photovoltaic element module. In addition, the outgoing energy can be restricted to increase the lifetime of an expensive outgoing lamp, thereby reducing running costs.

(6) An excellent solar cell can be provided by forming a metal member consisting of at least one of gold, silver, copper, stainless steel, and aluminum as a main component. The metal member from which electric power generated by the photovoltaic element is externally obtained must comprise a conductive material that minimizes output losses and has a high weather resistance, for example, long-term stability. A highly conductive photovoltaic element module with few resistance losses can be provided by using gold, silver, copper, stainless steel, or aluminum. In particular, stainless steel can be used to provide a relatively inexpensive rust and a weather resistant photovoltaic element module.

(7) The method of providing a medium capable of absorbing 10% or more of laser light having a wavelength of 0.4 $\mu$m to 2.0 $\mu$m on the surface of the metal member can include either employing as a medium a part of the metal member used for the photovoltaic element, or supplementally supplying a medium during the production step. A method wherein a part of the metal member is used as the medium includes treating the metal member in a strong-acid solution to oxidize or etch its surface, plating the surface of the metal member, and coating the surface of the metal member with carbon black. In addition, the method of supplementally supplying the medium during the production step includes closely contacting a material of a low surface reflectance with the surface of the metal member and irradiating the metal member with laser light from a low surface reflectance side of the material to weld the metal member with the material that has low surface reflectance. After welding, the material is preferably removed, but may not be removed depending on the material.

(8) When the medium capable of absorbing light is a color ink provided on the surface of the metal member, the process of applying the ink is very simple. The color ink can be applied by either a felt pen, jetting, or silk screen printing. Even when a highly reflective metal is used, a color ink can be provided on the surface of the metal to allow laser light to be easily introduced into the metal, thereby providing a stable welding strength to form a very reliable photovoltaic element module.

(9) The most stable welding strength can be obtained when the medium capable of absorbing laser light, which is provided on the surface of the metal member, is a film having a thickness bf 5 $\mu$m to 30 $\mu$m. Based on the film characteristics, the film material is selected to match the wavelength of laser light used and is advantageous in controlling quality, such as thickness. In addition, when the metal member is irradiated with laser light from the film side to weld the metal member with the film, the film can be easily peeled off after welding when the thickness of the film is from 5 $\mu$m to 30 $\mu$m.

(10) When the medium capable of absorbing laser light, which is provided on the surface of the metal member, consists of at least Fe, Ni, or solder, the welding strength can be stabilized, and the number of operations can also be reduced by plating Fe, Ni, or solder on the surface of the metal member. The material for the metal member from which electric power generated by the photovoltaic element is externally obtained must be conductive to minimize output losses. It must also be weather resistant, having such characteristics as long-term stability. Therefore, a material plated with Fe, Ni, or solder is preferably used when the metal member comprises, for example, copper.

The non-contact treatment of the present invention is an improved non-contact treatment using, for example, laser or halogen light to cut or weld a high-reflection material, such as gold, silver, copper, or aluminum that is often used for electric parts, such as photovoltaic elements. In addition to the effects described in the above (1) to (6), this method has the following effects.

(11) The present invention provides a non-contact treatment method wherein energy is supplied from an energy supply means, comprising placing on a material to be treated a non-adhering medium capable of absorbing energy and irradiating the non-adhering medium with energy. This method can achieve stable non-contact treatment because the physical characteristics of the placed medium determine the reflectance and can enable high-speed treatment, because the non-adhering anti-reflection material can be removed after the non-contact treatment.

(12) When the surface of the non-adhering medium that closely contacts the material to be treated has a surface roughness of 0.1 nm to 5,000 nm in mean square, more stable welding is possible and the non-adhering anti-reflection material can be easily removed. Beyond 5,000 nm, stable treatment is impossible, because the medium does not closely contact the material, whereby energy is not efficiently introduced to the inside of the material to be treated. In addition, below 0.1 nm the non-adhering medium sticks significantly to the material during energy irradiation, whereby the medium is not easily removed after the treatment.

(13) When the non-adhering medium has at least a polymer film, that is, when it is, for example, a polyethyleneterephthalate film mixed with carbon black, a polyethylenenaphthalate film with carbon black coated or deposited on its surface, or a material with a stainless steel foil laminated thereon, it can be removed more easily after energy irradiation because the above material is very strong and thin and because the polymer film is dissolved and volatilized during energy irradiation. In addition, polymer films are supplied in a long size enough to easily enable mass production.

(14) The effect of the present invention can be most effectively observed when the non-adhering medium is a magnetic tape. The magnetic tape is excellent in stable workability, mold-releasing capability, and high-speed treatment. The mold-releasing capability can be improved by closely contacting the surface of the magnetic tape with the material to be treated.

(15) An object of the present treatment method is to efficiently guide energy to the material to be treated. Particularly suitable energy is light, heat, or electromagnetic waves.

(16) The anti-reflection material (non-adhering medium) is irradiated with energy, while the non-adhering medium is holding the material to be treated, whereby the medium and the material are in close contact with each other to stabilize treatment.

(17) Since the non-adhering medium is removed by energy irradiation and/or after the non-contact treatment, the non-adhering medium does not remain in the treated part after the non-contact treatment, thereby preventing post-process appearance and defect problems.

(18) When the non-adhering medium is supplied from the form of a roll, which is wound up after energy irradiation, it can be continuously supplied to enable mass production and to increase treatment speed.

(19) An object of the present invention is to achieve a stable non-contact treatment, which is particularly suitable for welding or cutting.

(20) When the material to be treated is an electrode, it can be joined stably and reliably. In particular, when the material to be treated is an electrode for a photovoltaic element, the non-adhering and anti-reflection medium does not remains on the electrode portion, improving the appearance while avoiding the need to account for the compatibility with a package material.

Examples of the present invention are described below.

EXAMPLE 1

Figure 1A:
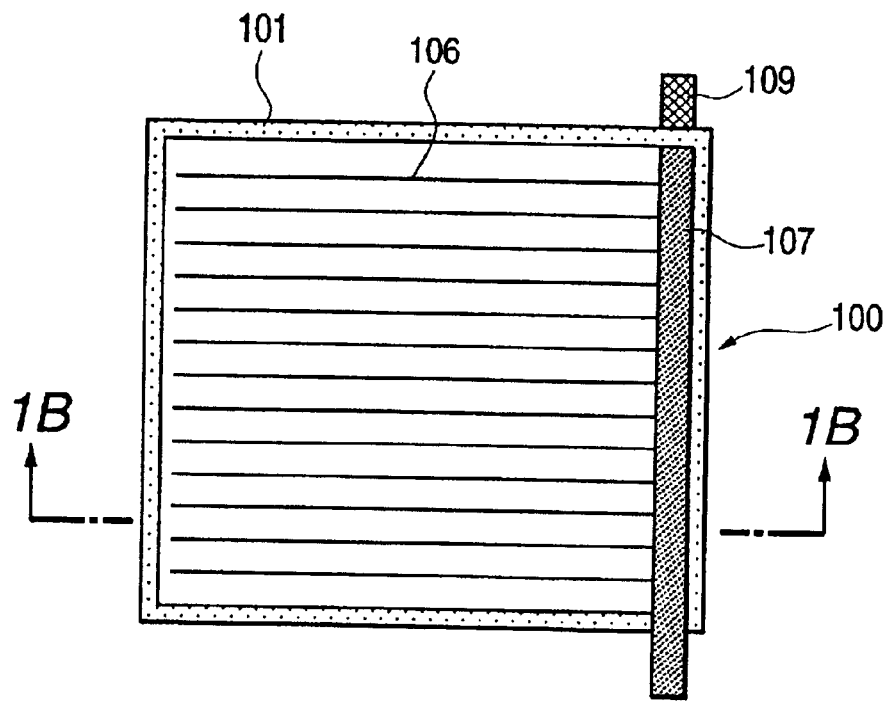
FIGS. 1A and 1B are schematic views showing an appearance of a photovoltaic element module according to Example 1 of the present invention.
Figure 1B:
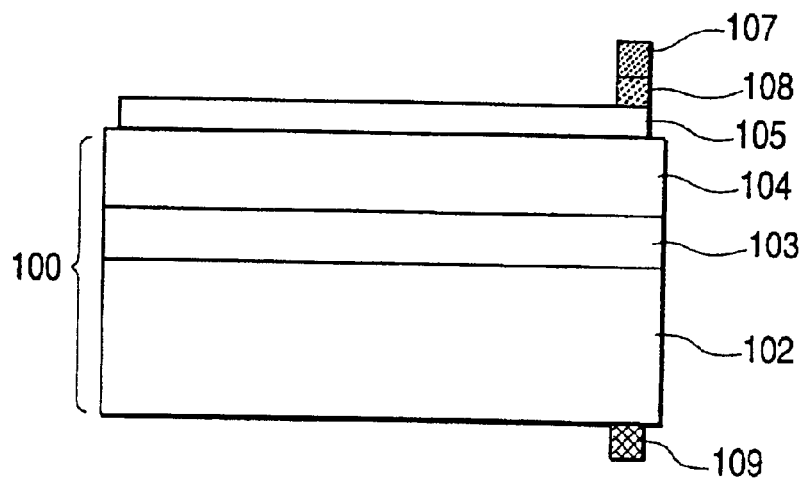
Figure 2A:
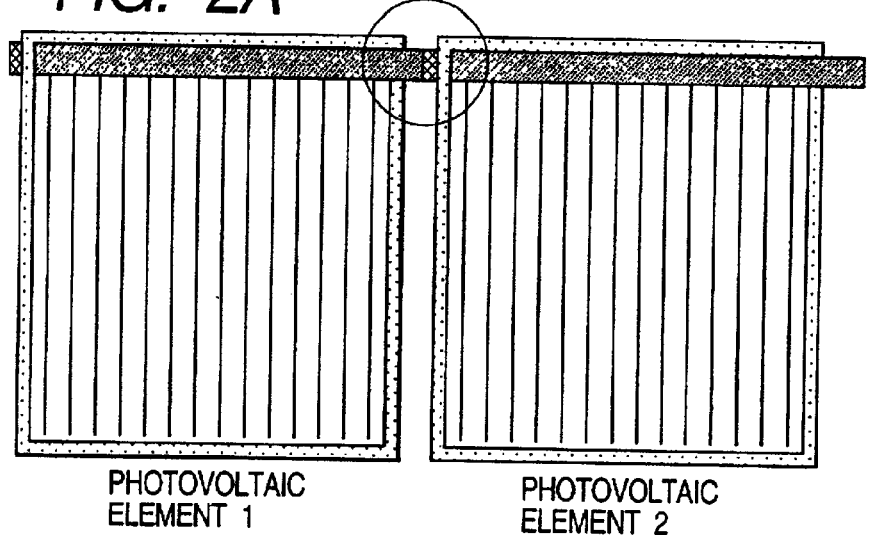
FIG. 2A is a plan view of two series-connected photovoltaic elements, each of which is shown in FIGS. 1A and 1B, as seen from their light-receiving surface side.
Figure 2B:
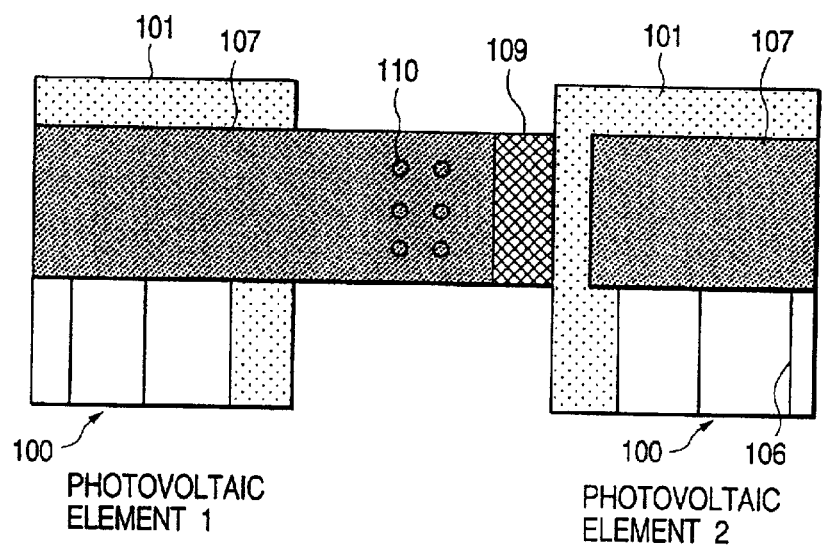
FIG. 2B is an enlarged view of the series-connected portion in FIG. 2A.
Figure 2C:
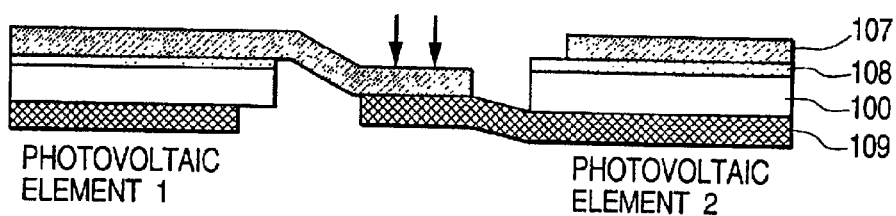
FIG. 2C is a sectional view of the portion as shown in FIG. 2B.

FIGS. 1A to 2C are schematic views showing the appearance of a photovoltaic element module according to Example 1 of the present invention. FIG. 1A is a plan view of a photovoltaic element as seen from its light-receiving surface, and FIG. 1B is a sectional view of the photovoltaic element shown in FIG. 1A, which is taken along line 1B—1B in FIG. 1A. In addition, FIG. 2A is a plan view of two photovoltaic elements connected in series as seen from their light-receiving surface, FIG. 2B is an enlarged view of the series-connected portion in FIG. 2A, and FIG. 2C is a sectional view of FIG. 2B.

In FIG. 1A, reference numeral 100 indicates a 300 mm×280 mm photovoltaic element comprising a substrate 102, a lower electrode layer 103, a semiconductor layer 104 consisting of amorphous silicon and having a photovoltaic function, and an upper electrode layer 105.

In this example, the substrate 102 for supporting the entire photovoltaic element comprises a stainless steel plate having a thickness of 150 $\mu$m. An Al layer about 2,000 Å thick and a ZnO layer about 13,000 Å thick were sequentially formed on the substrate 102 as the lower electrode layer 103 by a sputtering method. In addition, the semiconductor layer 104 was formed by sequentially stacking an n-, i-, p-, n-, i-, and p-type semiconductor layers this order from the substrate side by a plasma CVD method. The thickness of these layers was about 150 Å, 4,000 Å, 100 Å, 100 Å, 800 Å, and 100 Å, respectively. In addition, the upper electrode layer 105 was a transparent electrode consisting of a thin indium oxide film about 700 Å thick, formed by depositing In in an $O_2$ atmosphere using the resistance heating method. Furthermore, to prevent an effective light-receiving area from being affected by the adverse effect of a short circuit between the substrate and the transparent electrode that may occur when the outer circumference of the photovoltaic element is cut, etching paste containing $FeCl_3$, or $AlCl_3$ was coated on a part of the upper electrode layer 105 by using screen printing, and was heated and washed to linearly remove the part of the upper electrode layer 105 in order to form an etching line 101.

Subsequently, a copper foil strip 10 mm wide, 285 mm long, and 100 $\mu$m thick was formed near one side (280 mm long) of the back surface (on the substrate 102 side) of the photovoltaic element as a rear-surface-side conductive foil 109, using the method described in Japanese Patent Application Laid-Open No. 8-139349. One side of the copper foil strip protruded out from the photovoltaic element 100, as shown in FIG. 1A.

Subsequently, an insulating adhesive tape 108 comprising a polyimide as a base and having a width of 10 mm, a length of 280 mm, and a thickness of 50 $\mu$m was applied to one side of the front surface (upper electrode layer 105 side) of the photovoltaic element so that the tape 108 was opposed to the back-surface-side conductive foil 109.

Subsequently, a carbon-coating wire comprising a copper wire 100 $\mu$m in diameter and coated with a carbon paste was formed on the front side surface of the photovoltaic element as a collecting electrode 106. In this case, the carbon-coating wires were continuously formed on the upper electrode layer 105 and the insulating adhesive tape 108 at a pitch of 14 mm in such a manner, that the wires crossed the insulating tape.

Furthermore, a front-surface-side conductive foil 107 that is a further collecting electrode different from the collecting electrode 106, was formed on the insulating adhesive tape 108. The front-surface-side conductive foil 107 was formed by first placing a copper foil strip that was 20 mm wide, 285 mm long, and 100 $\mu$m thick on the insulating adhesive tape 108, with a part of the collecting electrode 106 interposed therebetween, and then heating, pressurizing and fixing the strip at 200° C. and 3 kg/cm$^2$ for 180 seconds. One side of the copper foil strip protruded out from the photovoltaic element 100 at a side opposite to the back-surface-side conductive foil 109, as shown in FIG. 1A.

To use the photovoltaic element produced in this manner for electric power generation, a plurality of photovoltaic elements were electrically connected in series to produce a photovoltaic element module. The connection method is described in FIGS. 2A to 2C.

As shown in FIGS. 2A to 2C, two adjacent photovoltaic elements were arranged in such a way, that a part of the front-surface-side conductive foil 107 of a photovoltaic element 1 overlapped a part of the back-surface-side conductive foil 109 of a photovoltaic element 2 over a distance of 3 mm.

Then, the overlapping portion between the front-surface-side conductive foil 107 of the photovoltaic element 1, the back-surface-side conductive foil 109 of the photovoltaic element 2 was irradiated with laser light to be welded, thereby mechanically and electrically connecting the two elements. Reference numeral 110 is a welding point. The laser for providing a sufficiently high power to weld a metal preferably has a wavelength of 0.4 $\mu$m and more. A solid laser having a wavelength of 0.4 $\mu$m to 2.0 $\mu$m is particularly preferable. Applicable lasers include a YAG laser, a phosphate glass laser, a silicate glass laser, and a $CO_2$ laser. In this example, a YAG laser (wavelength: 1.06 μm) was used to carry out the welding under the following conditions: outgoing energy: 15.0J; pulse width: 5.0 ms; welding point diameter: 0.5 mm; number of welding points: 6.

Subsequently, the electric resistance of the laser welded portion was measured at 0.013 Ω. With respect to the performance of the photovoltaic element 100, the effective area was 809.0 cm², the generated current density was 5.38 A, the generated current was 5.38 A, the generated voltage was 1.2 V, and the generated electric power was 6.45 W. Therefore, the resistance loss of the laser welded portion was 0.9 mW. This corresponds only to 0.015% of the electric power generated by the photovoltaic element 100.

In addition, the tensile strength of the laser welded portion was measured to be in a range of 8 kg to 15 kg.

In this example, with respect to the time required for laser welding, 2.0 seconds were required for feed-in and positioning the photovoltaic elements 1 and 2, 3.5 seconds were required for welding (including the movement of the laser beam outgoing tip), and 1.0 second was required for feed-out of the elements. Thus, the connection of two photovoltaic elements was completed in 6.5 seconds.

That is, this example can provide a reliable series-connected photovoltaic element module that is produced at a speed higher than that of conventional examples, as well as a method of producing it.

EXAMPLE 2

Figure 3A:
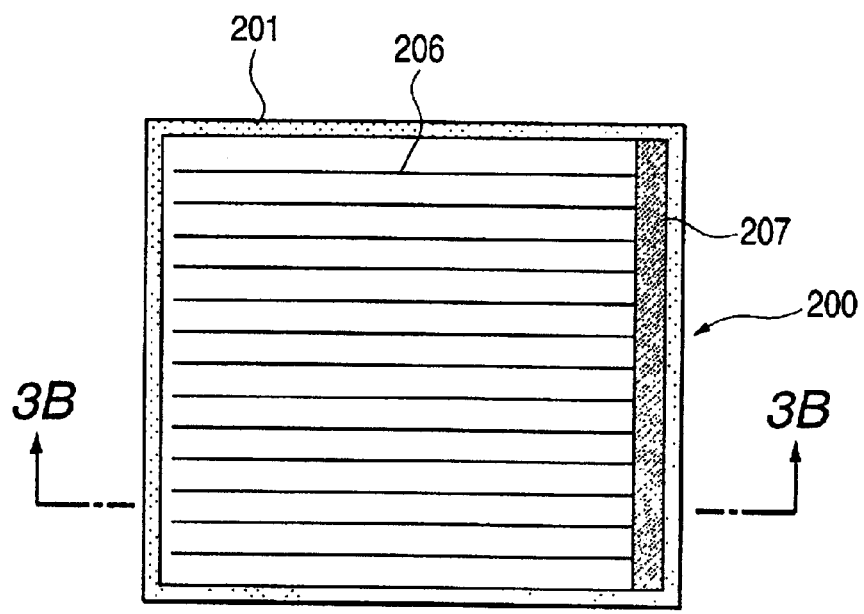
FIGS. 3A and 3B are schematic views showing an appearance of a photovoltaic element module according to Example 2 of the present invention.
Figure 3B:
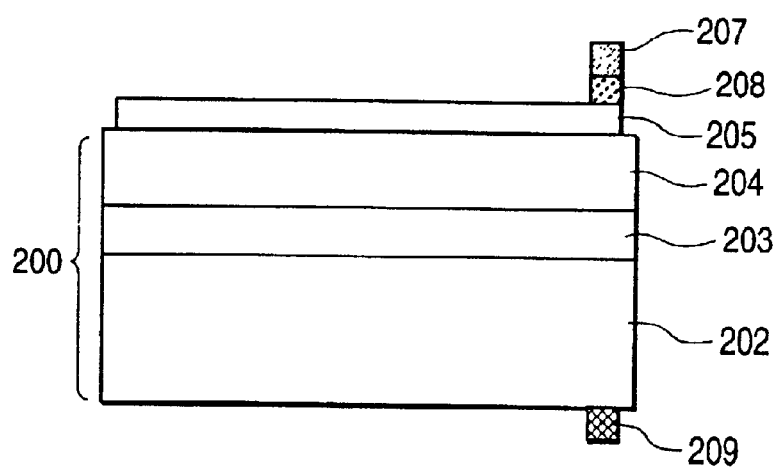
Figure 4A:
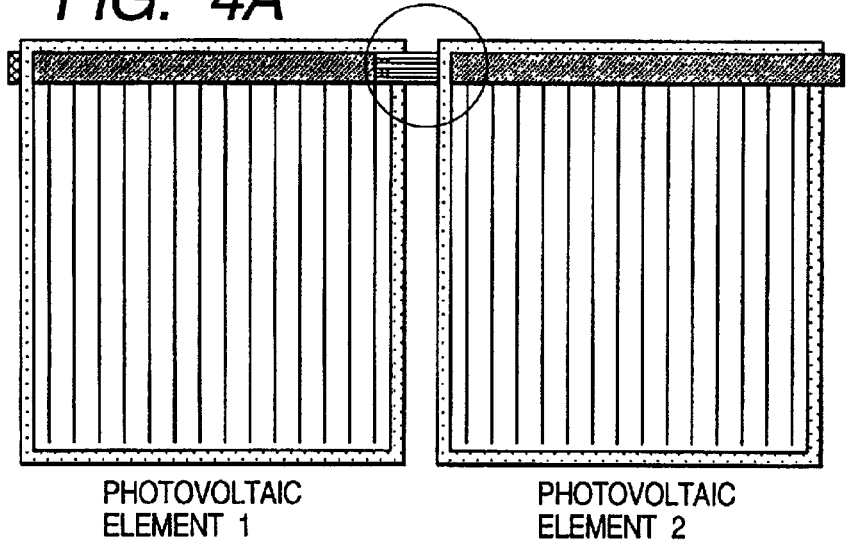
FIG. 4A is a plan view of two series-connected photovoltaic elements, each of which is shown in FIGS. 3A and 3B, as seen from their light-receiving surface side.
Figure 4B:
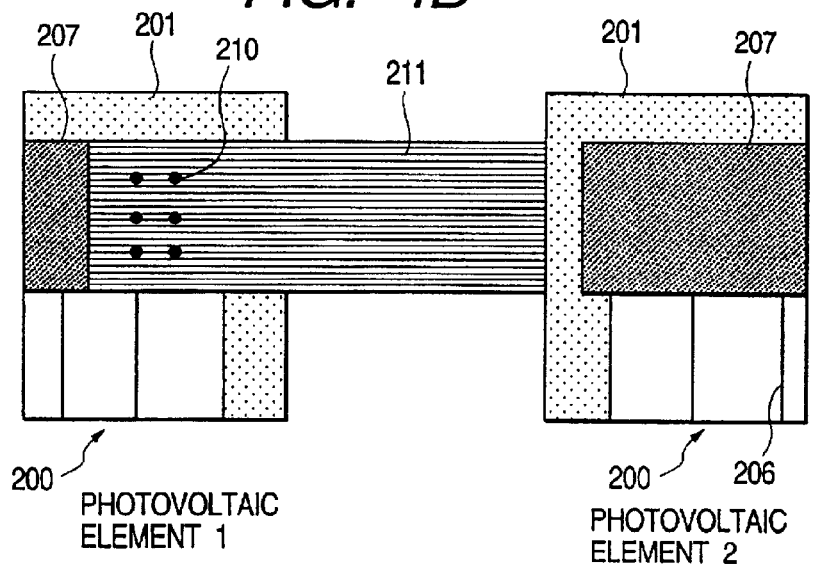
FIG. 4B is an enlarged view of the series-connected portion in FIG. 4A.
Figure 4C:
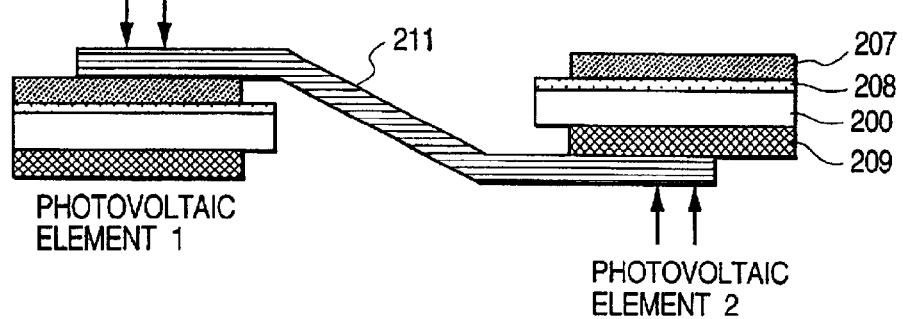
FIG. 4C is a sectional view of the portion shown in FIG. 4B.

FIGS. 3A to 4C are schematic views showing the appearance of a photovoltaic element module according to Example 2 of the present invention. FIG. 3A is a plan view of a photovoltaic element as seen from its light-receiving surface, and FIG. 3B is a sectional view of the photovoltaic element shown in FIG. 3A, which is taken along the line 3B—3B in FIG. 3A. In addition, FIG. 4A is a plan view of two photovoltaic elements connected in series as seen from their light-receiving surface, FIG. 4B is an enlarged view of the series-connected portion in FIG. 4A, and FIG. 4C is a sectional view of FIG. 4B.

In this example, a material was previously plated with Ni on a portion to be irradiated with laser light. The Ni plating was used as a medium capable of absorbing light.

In FIG. 3A, reference numeral 200 indicates a 300 mm×280 mm photovoltaic element comprising a substrate 202, a lower electrode layer 203, a semiconductor layer 204 consisting of amorphous silicon and having a photovoltaic function, and an upper electrode layer 205. Reference numeral 201 designates an etching line, 206 a collecting electrode, 207 a front-surface-side conductive foil that is a further collecting electrode different from the collecting electrode 206, 208 an insulating adhesive tape, and 209 a back-surface-side conductive foil. These components were formed of the same materials as in Example 1 by using the same method as in Example 1. The front-surface-side conductive foil 207 and the rear-surface-side conductive foil 209 were formed not to protrude out from the photovoltaic element 200.

A plurality of the above photovoltaic elements were electrically connected in series. The connection method is described with reference to FIGS. 4A to 4C.

In this example, a connection member 211 was employed for connections. First, the metal member 211, which is the connection member, was arranged to be in contact with the photovoltaic elements 1 and 2, as shown in FIG. 4C. Then, the metal member was irradiated with YAG laser light (indicated by the arrows in FIG. 4C) in the same manner as in Example 1, except the output energy was 6.0J. Reference numeral 210 denotes a welding point. The metal member 211 comprised a nickel-plated copper material (width: 10 mm; length: 275 mm; thickness: 100 μm), consisting of an inexpensive and conductive copper material plated with a 2 μm thick nickel-containing material that absorbs about 50% of YAG laser light having a wavelength of 1.06 μm. Since nickel absorbs YAG laser light much better than copper (that is, nickel has fewer losses caused by reflection from the surface of the metal), the output energy of the YAG laser could be reduced. In this example, the output energy from the YAG laser was 6.0J, but good welding results as in Example 1 could still be obtained.

Although, in this example, the medium capable of absorbing light was provided by plating the metal material (copper material) with nickel, the effects shown in FIG. 15 as described above could be obtained using a metal member coated with carbon black was used.

That is, this example can provide a reliable series-connected photovoltaic element module that costs less than Example 1 and that operates faster than the conventional examples, as well as its producing method.

EXAMPLE 3

Figure 5A:
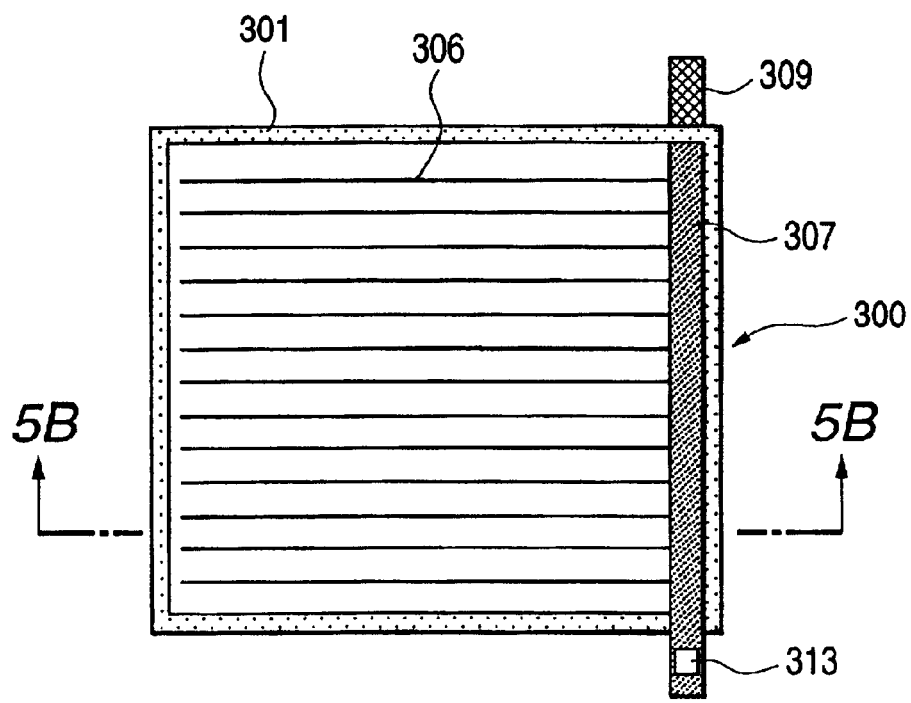
FIGS. 5A and 5B are schematic views showing an appearance of a photovoltaic element module according to Example 3 of the present invention.
Figure 5B:
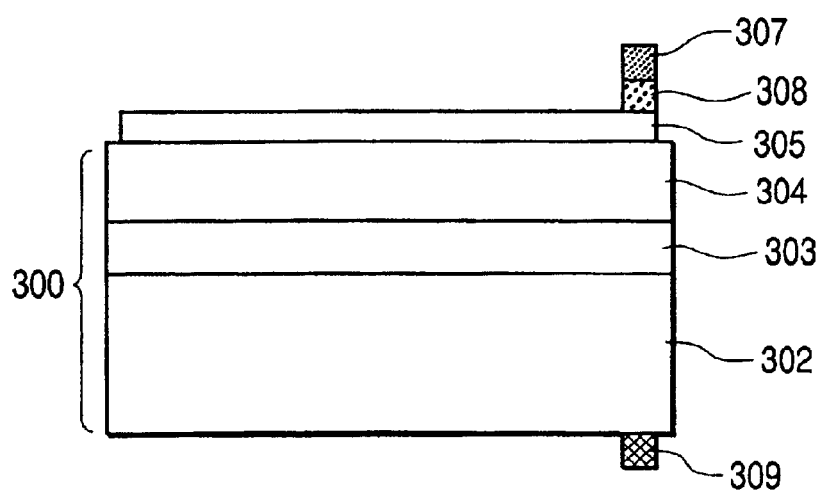
Figure 6A:
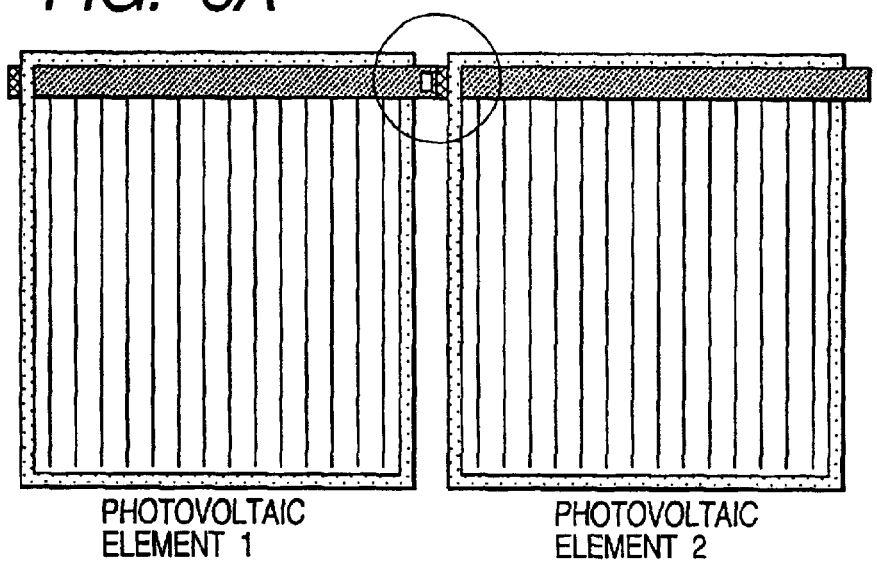
FIG. 6A is a plan view of two series-connected photovoltaic elements, each of which is shown in FIGS. 5A and 5B, as seen from their light-receiving surface side.
Figure 6B:
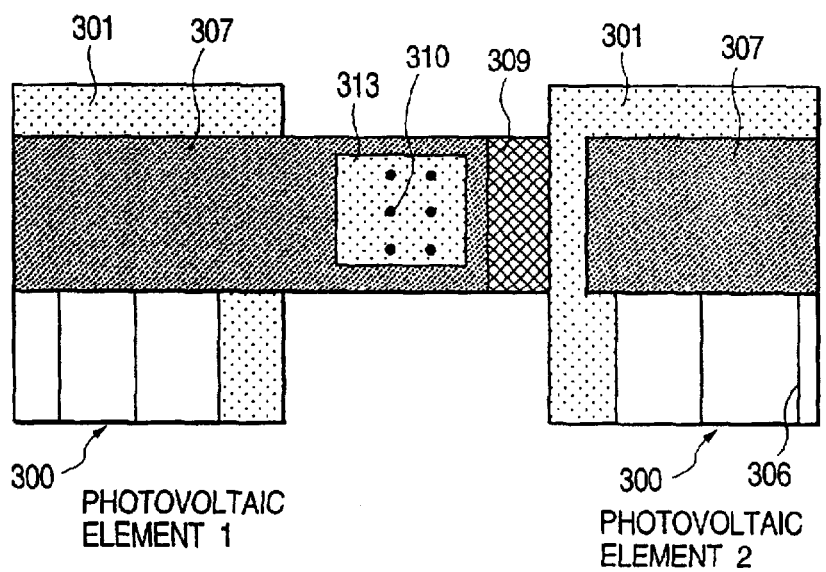
FIG. 6B is an enlarged view of the series-connected portion in FIG. 6A.
Figure 6C:
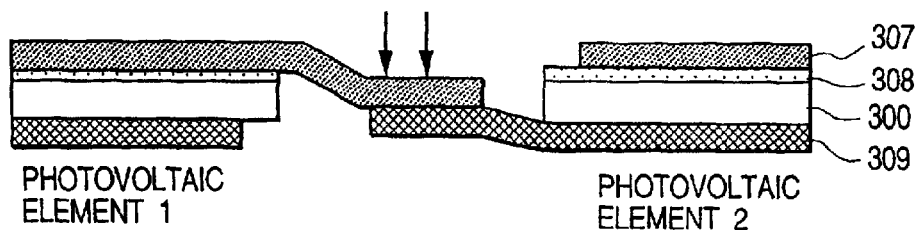
FIG. 6C is a sectional view of the portion shown in FIG. 6B.

FIGS. 5A and 5B and 6A to 6C are schematic views showing the appearance of a photovoltaic element module according to Example 3 of the present invention. FIG. 5A is a plan view of a photovoltaic element as seen from its light-receiving surface, and FIG. 5B is a sectional view of the photovoltaic element shown in FIG. 5A, which is taken along the line 5B—5B in FIG. 5A. In addition, FIG. 6A is a plan view of two photovoltaic elements connected in series as seen from their light-receiving surface, FIG. 6B is an enlarged view of the series-connected portion in FIG. 6A, and FIG. 6C is a sectional view of FIG. 6B.

In this example, a portion to be irradiated with laser light was previously coated with a color ink as a medium capable of absorbing light.

In FIG. 5A, reference numeral 300 indicates a 300 mm×280 mm photovoltaic element comprising a substrate 302, a lower electrode layer 303, a semiconductor layer 304 consisting of amorphous silicon and having a photovoltaic function, and an upper electrode layer 305. Reference numeral 301 designates an etching line, 306 a collecting electrode, 307 a front-surface-side conductive foil that is a further collecting electrode different from the collecting electrode 306, 308 an insulating adhesive tape, and 309 a back-surface-side conductive foil. These components were formed of the same materials as in Example 1 by using the same method as in Example 1.

A plurality of the above photovoltaic elements were electrically connected in series. The connection method is described with reference to FIGS. 6A to 6C.

As shown in FIGS. 6A to 6C, two adjacent photovoltaic elements were arranged in such a way that a part of the front-surface-side conductive foil 307 of the photovoltaic element 1 and a part of the back-surface-side conductive foil 309 of the photovoltaic element 2 overlapped over a distance of 3 mm.

Then, a blue felt pen (Oily Magic ink No. 500) was used to coat a color ink 313 (having an absorptivity of 30% at a wavelength of 1.06 um) as a medium capable of absorbing light on the overlapping portion of the front-surface-side conductive foil 307 of the photovoltaic element 1. Welding points 310 in the area coated with the color ink 313 were irradiated with a YAG laser under the same conditions as in Example 2 to mechanically and electrically connect the two conductive foils. For example, a solid laser having a wavelength of 0.4 $\mu$m to 2.0 $\mu$m may be used instead of the YAG laser.

This example produced good results, similar to those in Example 2.

Similar results were obtained by using a color ink having an absorptivity of 10% (a sky blue felt pen) instead of the color ink 313. In addition, similar results were obtained by using ink jet or silk screen printing instead of a felt pen.

EXAMPLE 4

Figure 7A:
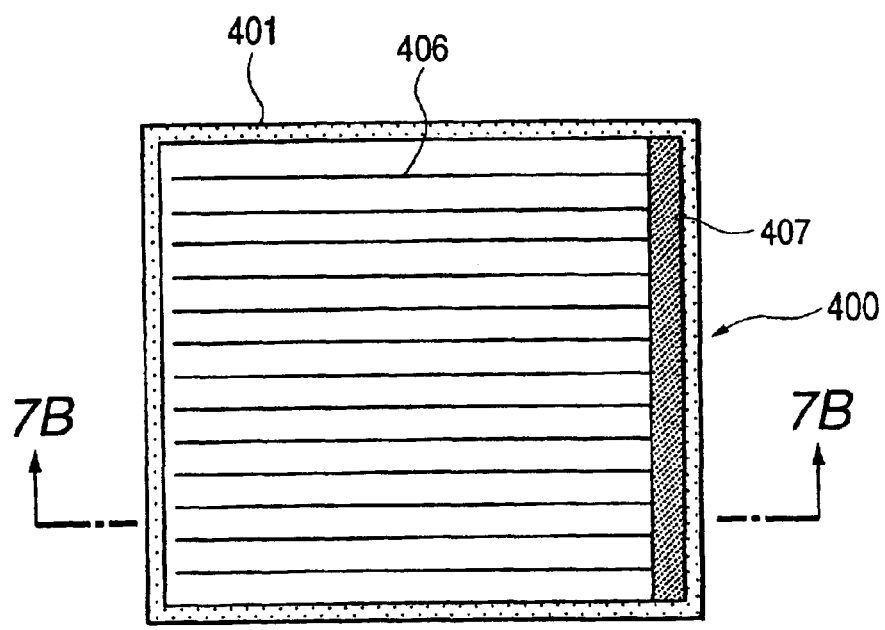
FIGS. 7A and 7B are schematic views showing an appearance of a photovoltaic element module according to Example 4 of the present invention.
Figure 7B:
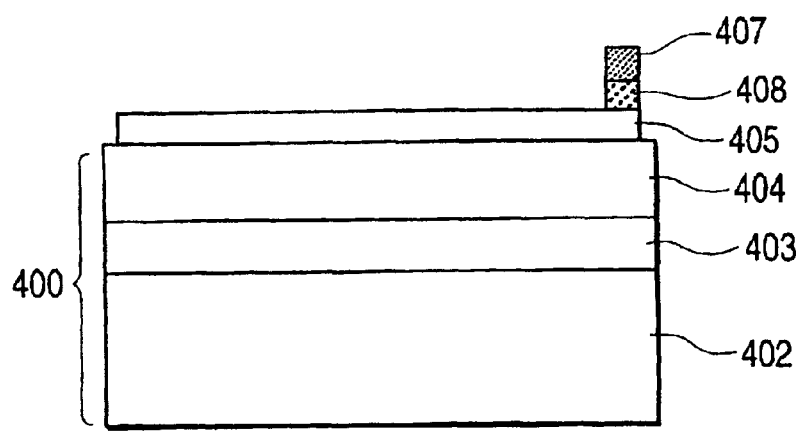
Figure 8A:
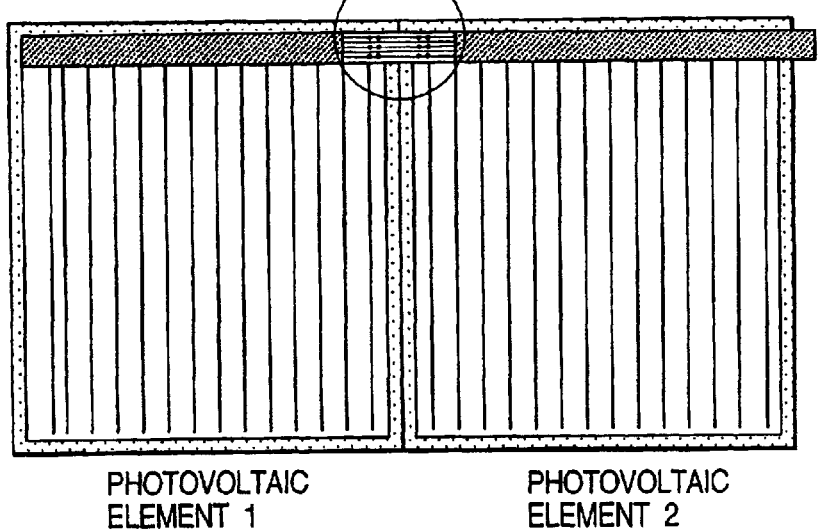
FIG. 8A is a plan view of two series-connected photovoltaic elements, each of which is shown in FIGS. 7A and 7B, as seen from their light-receiving surface side.
Figure 8B:
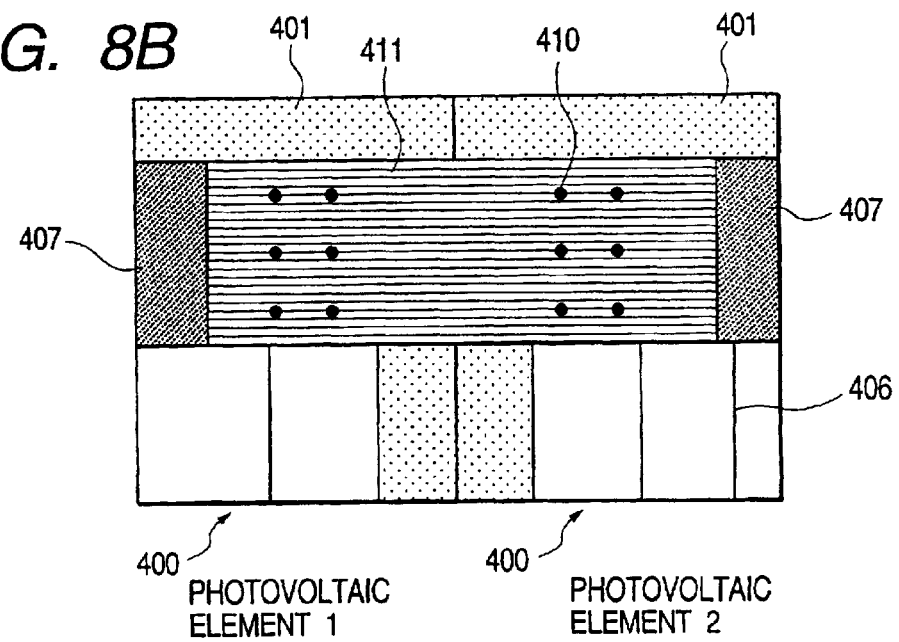
FIG. 8B is an enlarged view of the series-connected portion in FIG. 8A.
Figure 8C:
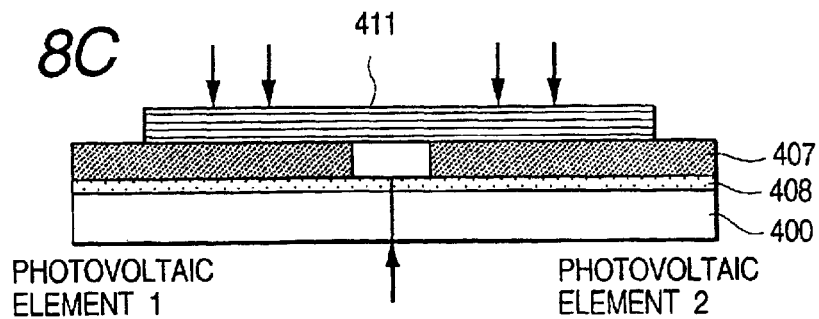
FIG. 8C is a sectional view of the portion shown in FIG. 8B.

FIGS. 7A and 7B and 8A to 8C are schematic views showing the appearance of a photovoltaic element module according to Example 4 of the present invention. FIG. 7A is a plan view of a photovoltaic element as seen from its light-receiving surface, and FIG. 7B is a sectional view of the photovoltaic element shown in FIG. 7A, which is taken along the line 7B—7B in FIG. 7A. In addition, FIG. 8A is a top view of two photovoltaic elements connected in parallel as seen from their light-receiving surface, FIG. 8B is an enlarged view of the series-connected portion in FIG. 8A, and FIG. 8C is a sectional view of FIG. 8B.

In this example, metal substrates were connected in parallel by laser welding. In FIG. 7A, reference numeral 400 indicates a 300 mm×280 mm photovoltaic element comprising a substrate 402, a lower electrode layer 403, a semiconductor layer 404 consisting of amorphous silicon and having a photovoltaic function, and an upper electrode layer 405. Reference numeral 401 designates an etching line, 406 a collecting electrode, 407 a front-surface-side conductive foil that is a further collecting electrode different from the collecting electrode 406, 408 is an insulating adhesive tape. These components were formed of the same materials as in Example 1 by using the same method as in Example 1. Since, however, the metal substrate 402 was used as a back-surface-side terminal, the back-surface-side conductive foil was not provided. In addition, the front-surface-side conductive foil 407 was formed not protrude out from the photovoltaic element 400.

A plurality of photovoltaic elements were electrically connected in parallel. The connection method is described with reference to FIGS. 8A to 8C.

As shown in FIGS. 8A to 8C, two adjacent photovoltaic elements were arranged in such a way that the substrate 400 of the photovoltaic element 1 and the substrate 400 of the photovoltaic element 2 were in close contact. The closely contacting portion between the two substrates was irradiated with YAG laser light to weld and connect them to each other. Although this example used the YAG laser, one of the other lasers described above may be employed. Since this example used stainless steel mainly consisting of Fe (having an absorptivity of about 30% at a wavelength of 1.06 $\mu$m) as the substrate 400, stable welding could be achieved while applying low energy.

Subsequently, a metal member 411, which also functioned as a connection member, was placed to contact the front-surface-side conductive foils 407 of the photovoltaic elements 1 and 2, and the metal member 411 was irradiated with YAG laser light to weld the elements together in order to connect them in parallel. Reference numeral 410 indicates a welding point. The metal member 411 was similar to the metal member 211 and the welding conditions were similar to these in Example 2.

The present invention enables both the front and back sides to be stably welded at low cost and provides a parallel-connected photovoltaic element module having excellent connection stability, as well as a method of producing it.

EXAMPLE 5

Figure 9A:
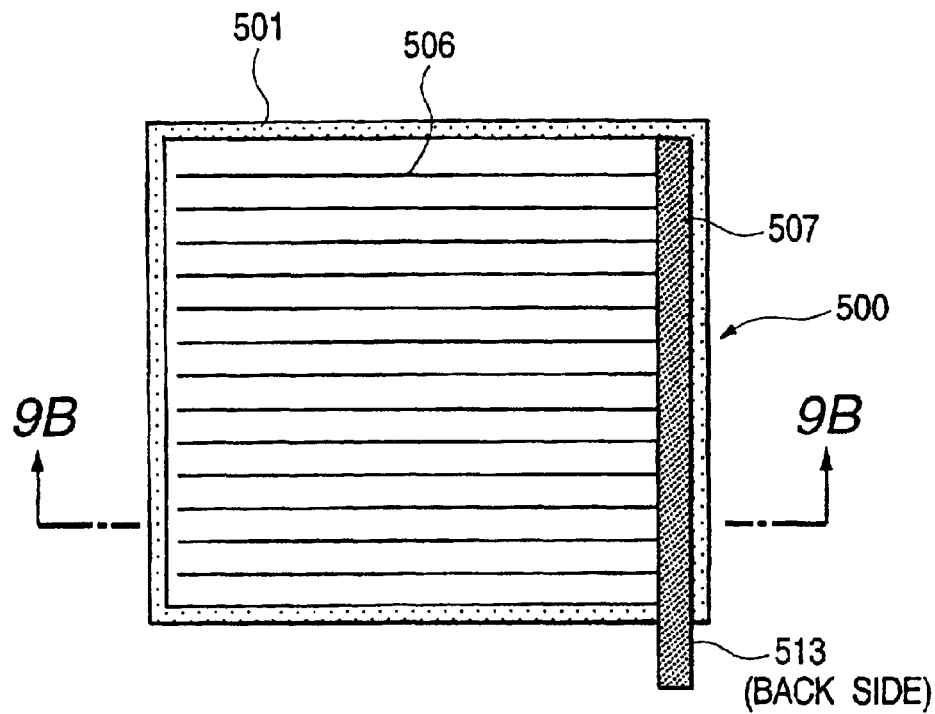
FIGS. 9A and 9B are schematic views showing an appearance of a photovoltaic element module according to Example 5 of the present invention.
Figure 9B:
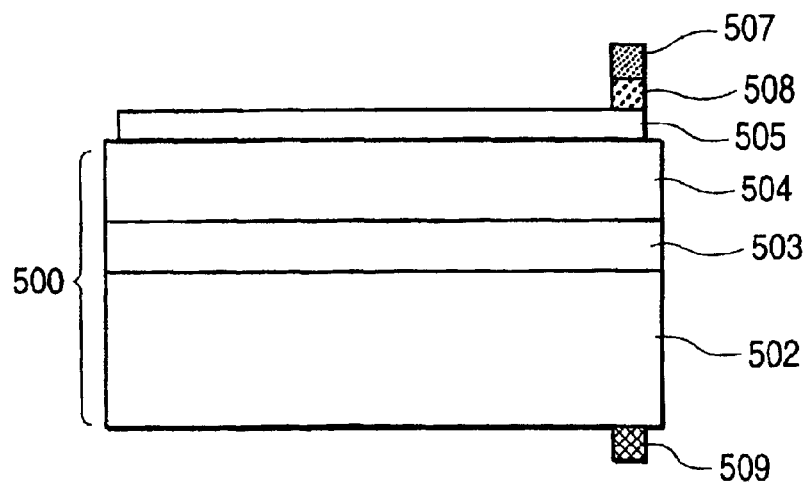
Figure 10A:
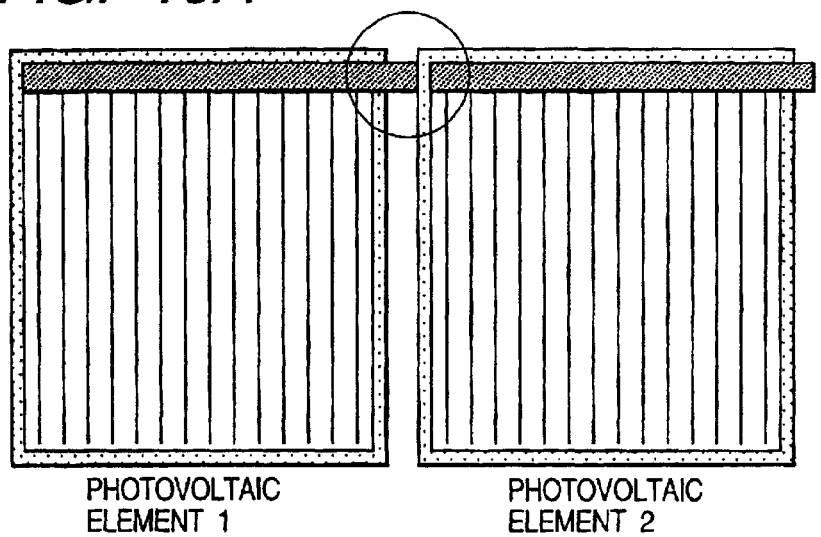
FIG. 10A is a plan view of two series-connected photovoltaic elements, each of which is shown in FIGS. 9A and 9B, as seen from their light-receiving surface side.
Figure 10B:
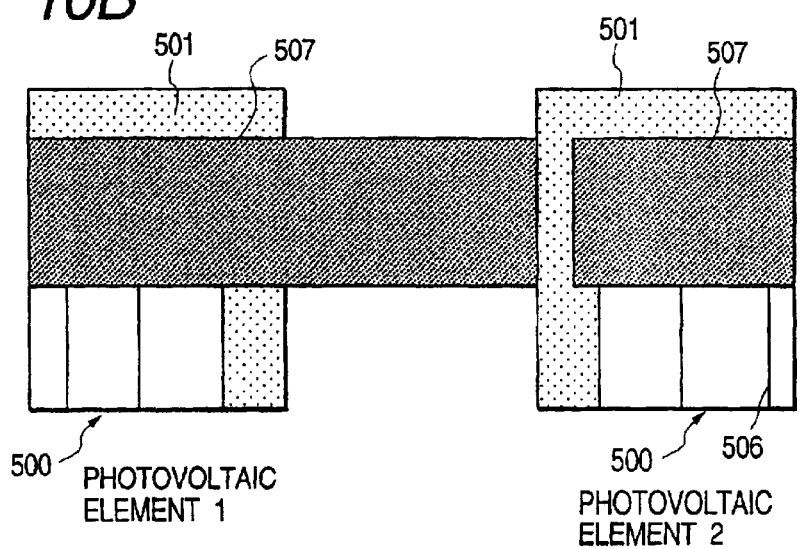
FIG. 10B is an enlarged view of the series-connected portion in FIG. 10A.
Figure 10C:
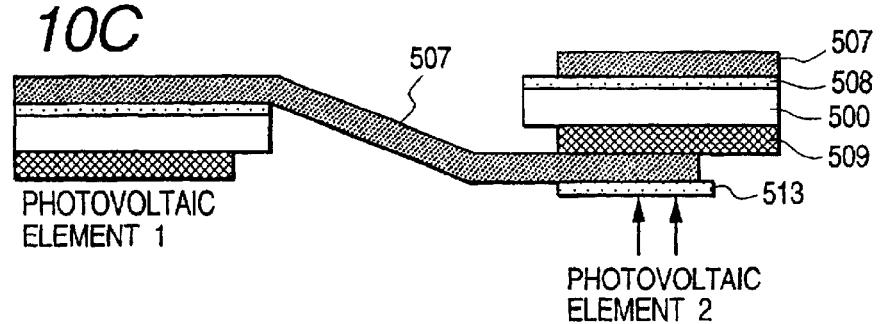
FIG. 10C is a sectional view of the portion shown in FIG. 10B.
Figure 11A:
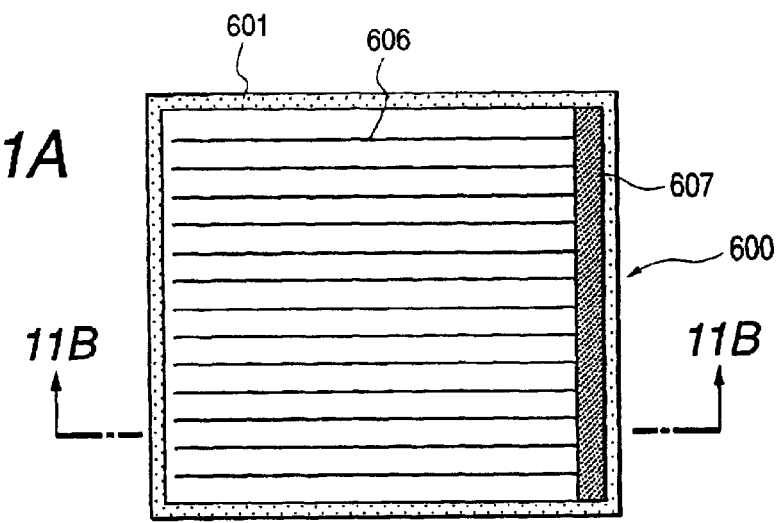
FIGS. 11A, 11B, and 11C are schematic views showing an appearance of a conventional photovoltaic element module.
Figure 11B:
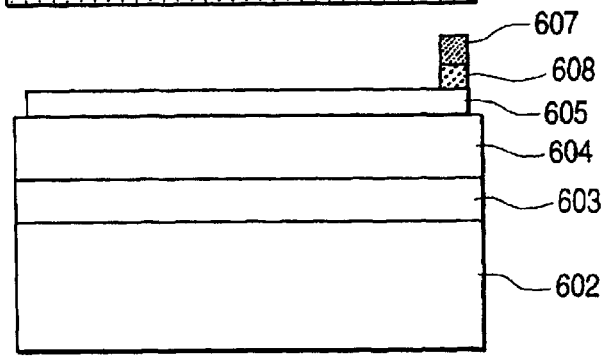
Figure 11C:
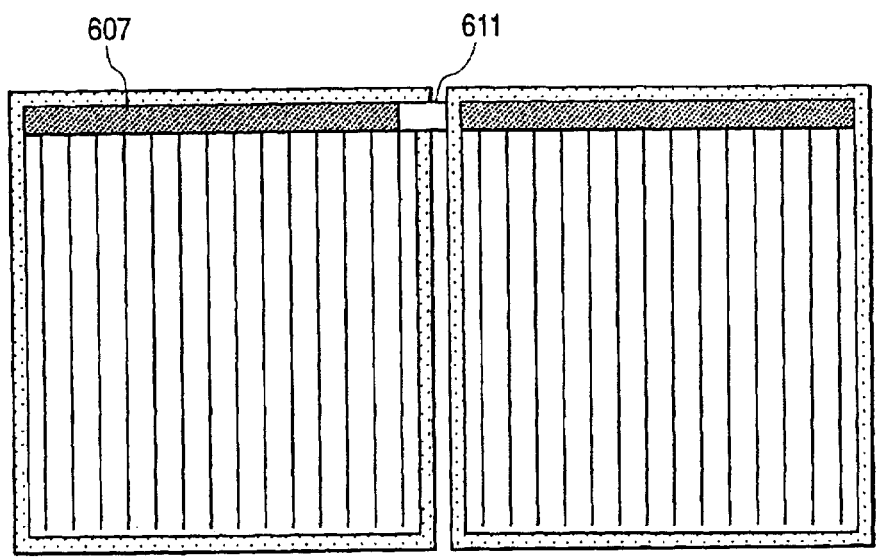

FIGS. 9A to 10C are schematic views showing the appearance of a photovoltaic element module according to Example 5 of the present invention. FIG. 9A is a plan view of a photovoltaic element as seen from its light-receiving surface, and FIG. 9B is a sectional view of the photovoltaic element shown in FIG. 9A, which is taken along the line 9B—9B in FIG. 9A. In addition, FIG. 10A is a plan view of two photovoltaic elements connected in series as seen from their light-receiving surface, FIG. 10B is an enlarged view of the series-connected portion in FIG. 10A, and FIG. 10C is a sectional view of FIG. 10B.

In this example, a film was previously arranged on a portion to be irradiated with laser light, as a medium capable of absorbing light.

In FIG. 9A, reference numeral 500 indicates a 300 mm×280 mm photovoltaic element comprising a substrate 502, a lower electrode layer 503, a semiconductor layer 504 consisting of amorphous silicon and having a photovoltaic function, and an upper electrode layer 505. Reference numeral 501 designates an etching line, 506 a collecting electrode, 507 a front-surface-side conductive foil that is a further collecting electrode different from the collecting electrode 506, 508 an insulating adhesive tape, and 509 a back-surface-side conductive foil. These components were formed of the same materials as in Example 1 by using the same method as in Example 1. The back-surface-side conductive foil 509 was formed not to protrude out from the photovoltaic element 500. The front-surface-side foil 507 was 10 mm wide, 285 mm long, and 100 $\mu$m thick, and one side of the foil 507 extended outward from the photovoltaic element 500.

A plurality of photovoltaic elements were electrically connected in series. The connection method is described with reference to FIGS. 10A to 10C.

As shown in FIGS. 10A to 10C, two adjacent photovoltaic elements were arranged in such a way, that a part of the front-surface-side conductive foil 507 of the photovoltaic element 1 and a part of the back-surface-side conductive foil 509 of the photovoltaic element 2 overlapped over a distance of 3 mm. In this case, the interval between the photovoltaic elements 1 and 2 was 2 mm.

A film 513 was arranged as a medium capable of absorbing light on the overlapping portion between the front-surface-side conductive foil 507 of the photovoltaic element 1 and the back-surface-side conductive foil 509 of the photovoltaic element 2. This example used a black PET (polyethylene-terephthalate) tape (MELINEX 427, produced by ICI Japan Ltd.; absorptivity at a wavelength of 1.06 $\mu$m: 65%; thickness: 20 $\mu$m; width: 13 mm) was used as the film 513. Welding points (not shown in the drawings) on the surface of the film 513 were irradiated with YAG laser light as shown by the arrows in FIG. 10C to mechanically and electrically connect two conductive foils. For example, a solid laser having a wavelength of 0.4 $\mu$m to 2.0 $\mu$m may be used instead of the YAG laser.

This example provided good results, similar to those obtained in Example 2.

Figure 16:
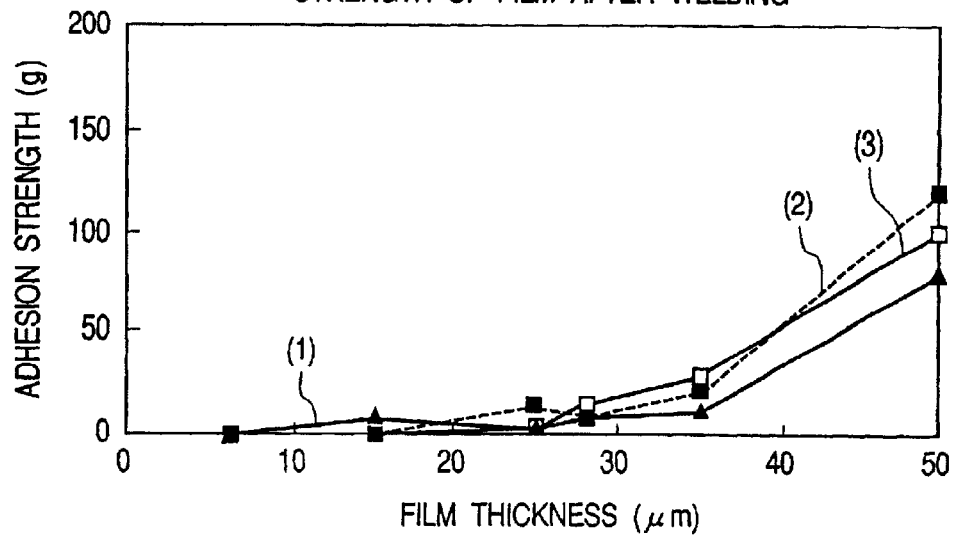
FIG. 16 is a graph showing the relationship between the thickness of a film and the adhesive strength of the film after welding.

When a film is used as the medium, as in this example, a film having a thickness of 5 $\mu$m to 30 $\mu$m is preferable because this film can be easily removed after welding. When the thickness of the film is less than 5 μm, the film is likely to be torn off while being peeled off. In addition, when the thickness of the film is greater than 30 μm, the adhesion strength of the film becomes excessively high, as shown in FIG. 16, thereby requiring a strong force to peel off the film. As a result, the welded metal member may be deformed or the film may be torn off. In FIG. 16, symbol (1) designates LUMIRROR X (produced by Toray Industries, Inc.), symbol (2) denotes MELINEX 427 (produced by ICI Japan Ltd.), or symbol (3) indicates OPP silicon (produced by Panac Co., Ltd.). FIG. 16 shows the results obtained when used the films (1), (2) and (3). Such an increase in adhesion strength is caused by the adhesion of the film base material (medium) melted by laser light of a constant diameter to the metal member. This does not present a problem when the film base material is so thin that only a small amount of the base material melts. However, a problem arises when the thickness of the film base material is greater than a certain value, and the melted amount of the base material and the adhesion strength exhibit a positive correlation.

The present invention is not limited to the above examples.

EXAMPLE 6

Figure 17:
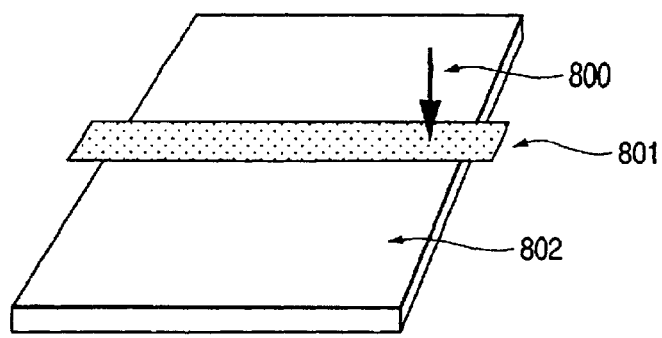
FIG. 17 is a schematic view showing a laser treatment method according to Example 6.

According to this example, an aluminum sheet that constituted an electrode for an electric part was cut. FIG. 17 is a schematic view showing a laser treatment method according to Example 6 of the present invention.

In FIG. 17, reference numeral 800 indicates the irradiation of $CO_2$ laser excited infrared light, and reference numeral 801 indicates a non-adhering medium consisting of black polyethyleneterephthalate film 10 mm wide, 13 cm long, and 0.3 mm thick. Although this example used a MELINEX 427 film produced by ICI Japan Ltd. as the non-adhering medium 801, the experiments conducted by the inventors confirmed that performance similar to that of this example could be obtained when used LUMIRROR X30 produced by Toray Industries, Inc. The surface roughness of the nonadhering medium 801 was measured to be in a range of 0.1 nm to 2 nm in mean square, by using a three-dimensional surface roughness meter of a non-contact optical system. In addition, reference numeral 802 indicates a material to be treated consisting of an aluminum sheet having a length of 10 cm and a thickness of 0.5 mm.

The material 802 was fixed to a jig (not shown in the drawings) having a groove formed at a laser irradiation position, and a non-adhering medium 801 was placed on the material 802 at a position to be irradiated with laser light. Subsequently, a presser jig (not shown in the drawings), having a groove to be penetrated by laser light at a cutting position, was used to closely contact the non-adhering medium 801 with the material 802 at 1 kg/cm² pressure. Subsequently, using Ar as a shield gas, the material to be treated was irradiated with laser light 800 along the groove to be penetrated by the light to cut the material 802. The irradiation conditions of the laser light 800 were as follows: outgoing energy: 251; pulse width: 3 ms; pulse repetition speed: 15 PPS; laser beam diameter: φ0.5 mm.

The laser irradiated portion of the non-adhering medium 801 was melted and evaporated by the irradiation of laser light. Once cutting was completed, the presser jig was opened and the remaining non-adhering medium 801 was removed by using tweezers to complete the series of operations. Although in this example the tweezers are used to remove the non-adhering medium 801, a method of blowing the medium off by a shield gas may be suitably used.

Since in this example the non-adhering medium 801 was placed on the laser light-irradiated surface of the material to be treated, the amount of energy required for cutting could be substantially reduced. Furthermore, since the non-adhering medium 801 is removed after laser irradiation, the non-adhering medium 801 does not remain after the series of operations have been finished, thereby avoiding appearance problems and preventing problems from occurring in the post-process.

This example teaches a stable laser treatment, because the treatment can be carried out at a lower energy than the conventional techniques and the reflectance is determined by the physical characteristics of the placed non-adhering medium. In addition, the material is treated while holding the non-adhering medium, thereby enabling stable close contact and, thus, a stable laser treatment. Furthermore, the operator needs only to place the non-adhering medium, thereby increasing the treatment speed. In addition, since the nonadhering medium can be easily removed after laser treatment, the present example provides a laser treatment method that avoids appearance problems, while also preventing problems in the post-process.

EXAMPLE 7

In this example, laser light was used to weld the electrodes of photovoltaic elements. The electrodes consisted of a copper foil.

Figure 18A:
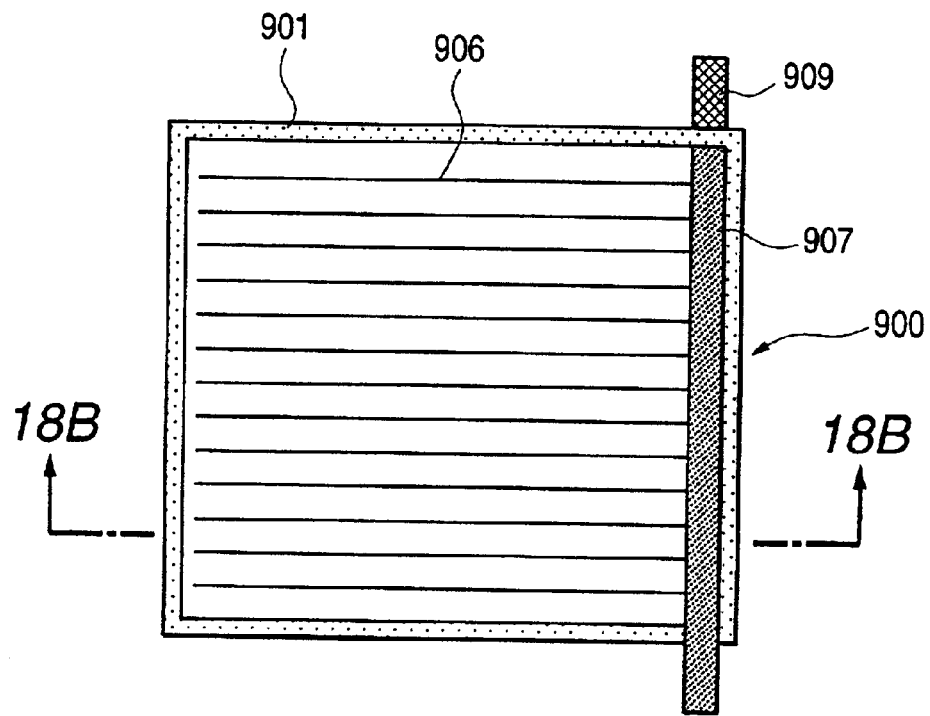
FIGS. 18A and 18B are schematic views showing an appearance of a photovoltaic element module according to Example 7 of the present invention.
Figure 18B:
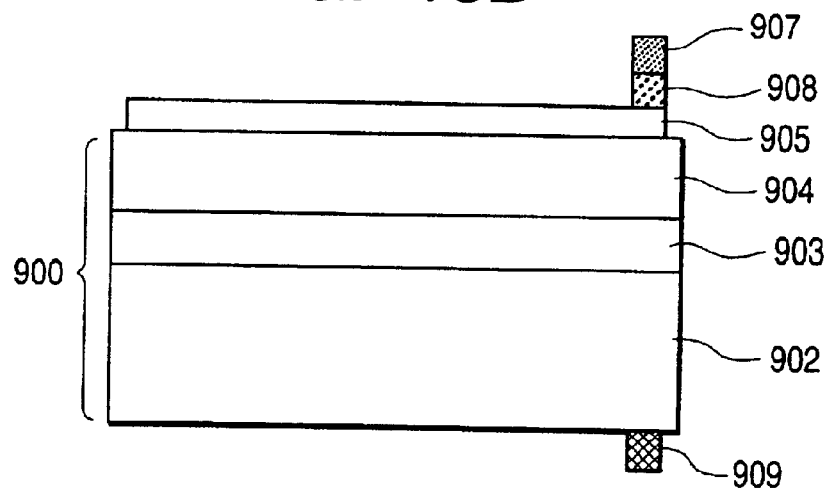
Figure 19A:
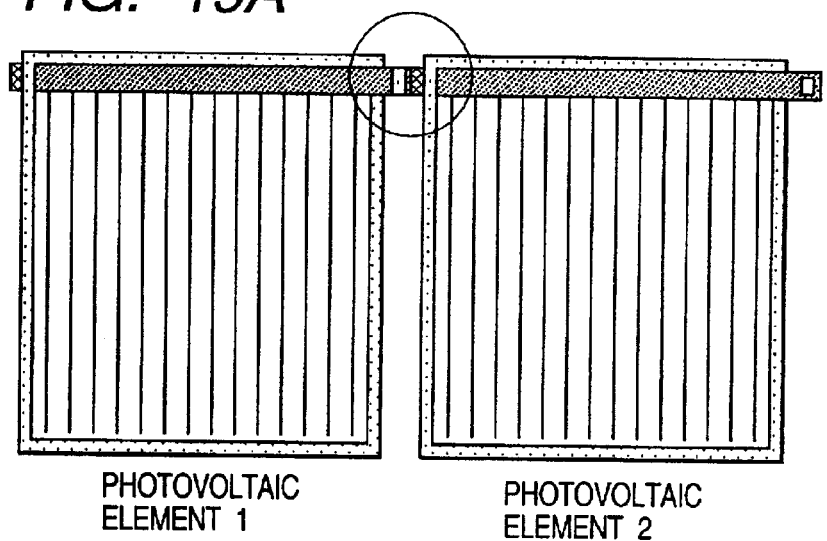
FIG. 19A is a plan view of two series-connected photovoltaic elements, each of which is shown in FIGS. 18A and 18B, as seen from their light-receiving surface side.
Figure 19B:
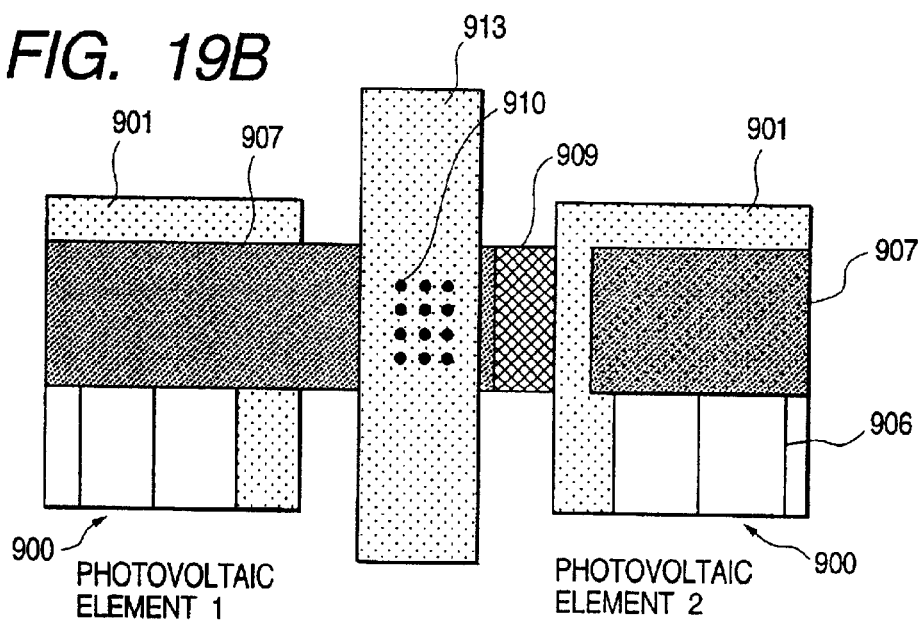
FIG. 19B is an enlarged view of the series-connected portion in FIG. 19A.
Figure 19C:
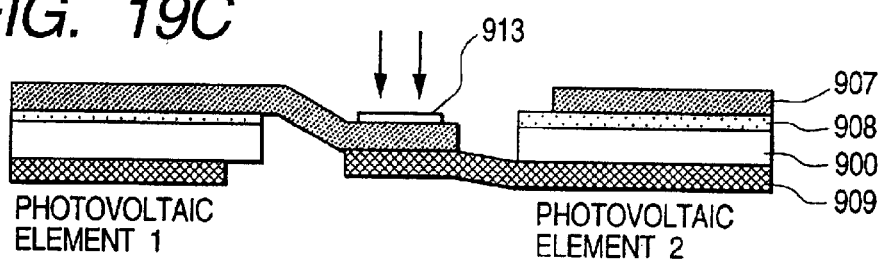
FIG. 19C is a sectional view of the portion shown in FIG. 19B.
Figure 20:
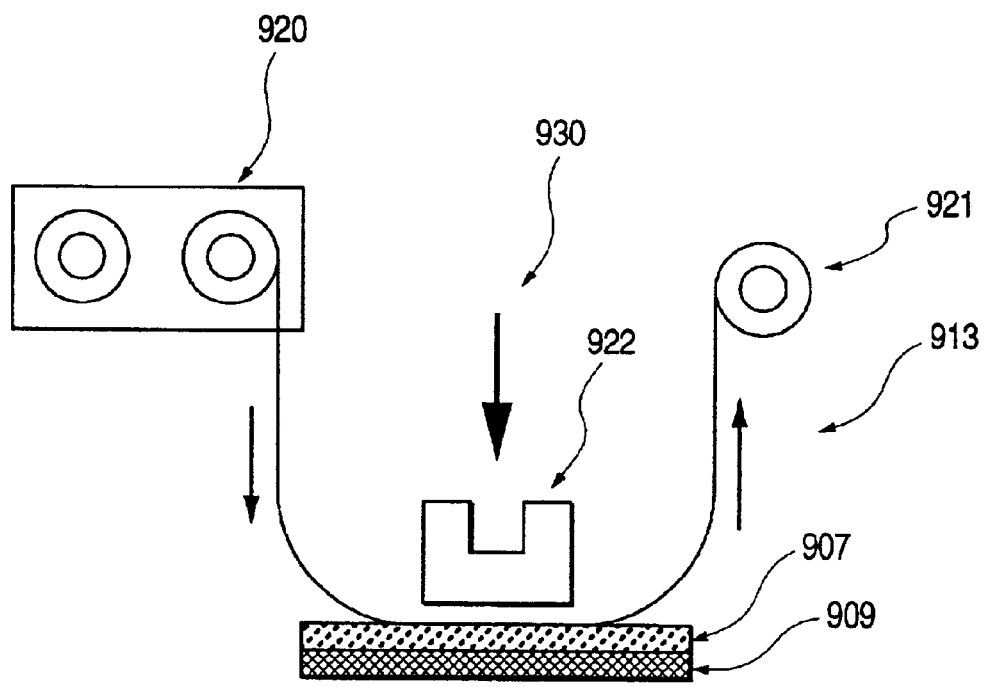
FIG. 20 is a schematic view showing a method of supplying a non-contact medium.

FIGS. 18A and 18B and 19A to 19C are schematic views showing the appearance of a photovoltaic element module according to Example 7 of the present invention. FIG. 18A is a plan view of a photovoltaic element as seen from its light-receiving surface, and FIG. 18B is a sectional view of the photovoltaic element shown in FIG. 18A, which is taken along the line 18B—18B in FIG. 18A. In addition, FIG. 19A is a plan view of two photovoltaic elements connected in series as seen from their light-receiving surface, FIG. 19B is an enlarged view of the series-connected portion in FIG. 19A, and FIG. 19C is a sectional view of FIG. 19B. FIG. 20 is a schematic view showing the method of supplying nonadhering and anti-reflection materials according to Example 7.

In FIG. 18A, reference numeral 900 indicates a 300 m×280 mm photovoltaic element comprising a substrate 902, a lower electrode layer 903, a semiconductor layer 904 consisting of amorphous silicon and having a photovoltaic function, and an upper electrode layer 905.

In this example, the substrate for supporting the entire photovoltaic element comprises a 150 μm thick stainless steel plate. An Al layer about 2,000 Å thick and a ZnO layer about 13,000 Å thick were sequentially formed on the substrate 902 as the lower electrode layer 903 by using the sputtering method. In addition, the semiconductor layer 904 was formed by sequentially stacking an n-, i-, p-, n-, i-, and p-type semiconductor layers in this order from the substrate side by using the plasma CVD method. The thicknesses of these layers were about 150 Å, 4,000 Å, 100 Å, 100 Å, 800 Å, and 100 Å, respectively. In addition, the upper electrode layer 905 was a transparent electrode consisting of a thin indium oxide film of about 700 Å in thickness, and was formed by depositing In in an $O_2$ atmosphere by using the resistance heating method. Furthermore, to prevent an effective light-receiving area from being affected by the adverse effect of a short circuit between the substrate and the transparent electrode that may occur when the outer circumference of the photovoltaic element is cut, etching paste containing $FeCl_3$ or $AlCl_3$ was coated on a part of the upper electrode layer 905 by using screen printing, and was heated and washed to linearly remove the part of the upper electrode layer 905 to thereby form an etching line 901.

Subsequently, a copper foil strip having a width of 10 mm, a length of 285 mm, and a thickness of 100 µm was formed near one side (280 mm long) of the back surface (on the substrate 902 side) of the photovoltaic element as a back-surface-side conductive foil 909, by using the method disclosed in Japanese Patent Application Laid Open No. 8-139349. One side of the copper foil strip protruded out from the photovoltaic element, as shown in FIG. 18A.

Subsequently, an insulating adhesive tape 908 comprising polyimide as a base and having a width of 10 mm, a length of 280 mm, and a thickness of 50 µm was applied to one side of the front surface (on the upper electrode layer 905) of the photovoltaic element such that the tape 908 is opposed to the back-surface-side conductive foil 909.

Subsequently, a carbon-coating wire comprising a copper wire 100 µm in diameter and coated with carbon paste was formed on the front surface of the photovoltaic element as a collecting electrode 906. In this case, the carbon-coating wires were continuously formed on the upper electrode layer 905 and the insulating adhesive tape 908 at a pitch of 14 mm such that the wires crossed the insulating tape.

Furthermore, a front-surface-side conductive foil 907 that was a further collecting electrode different from the collecting electrode 906 was formed on the insulating adhesive tape 908. The front-surface-side conductive foil 907 was formed by placing a copper foil strip having a width of 10 mm, a length of 285 mm, and a thickness of 100 µm on the insulating adhesive tape 908 with interposition of a part of the collecting electrode 906 therebetween and heating, pressurizing, fixing the strip at 200° C. and 1 kg/cm$^2$ for 60 seconds. One side of the copper foil strip was protruded out from the photovoltaic element 900 on a side opposite to the back-surface-side conductive foil 909, as shown in FIG. 18A.

To use the photovoltaic element produced in this manner for electric power generation, a plurality of photovoltaic elements were electrically connected in series to produce a photovoltaic element module. The connection method is described in FIGS. 19A to 19C.

As shown in FIGS. 19A to 19C, two adjacent photovoltaic elements were arranged so that a part of the front-surface-side conductive foil 907 of a photovoltaic element 1 overlapped a part of the backsurface-side conductive foil 909 of a photovoltaic element 2 over a distance of 3 mm.

Subsequently, a non-adhering medium 913 was placed on the overlapping laser-welded portion between a part of the front-surface-side conductive foil 907 of the photovoltaic element 1 and a part of the back-surface-side conductive foil 909 of the photovoltaic element 2. As the non-adhering medium 913, a commercially available magnetic tape was used, which comprises a magnetic substance, such as carbon black, coated or deposited on one side of polyethyleneterephthalate or polyethylenenaphthalate. This example used T-120VF produced by Sony Corporation, but the experiments conducted by the inventors confirmed that performance similar to that of this example can be obtained when used other magnetic tapes, such as P6-120HMP2 or VXST-120VF, produced by Sony Corporation, or NV-ST120XPZ or NV-TTC40HGK produced by Matsushita Electric Industrial Co., Ltd., or heat transfer ribbons, such as TL-12K produced by King Jim Co., Ltd., CF-PR190 produced by Matsushita Electric Industrial Co., Ltd., or JW-Z180 produced by Toshiba Corporation. Since these magnetic tapes are supplied in a form of a roll, a subsequent laser treatment can be prepared by releasing the presser jig and feeding the tape forward after each laser treatment. In addition, the surface roughness of the magnetic surfaces of these magnetic tapes was measured to be in a range of 5 nm to 20 nm in mean square.

Furthermore, a presser jig (not shown in the drawings) was used to press the magnetic tape that was the non-adhering medium 913 at 10 kg/cm$^2$ with the magnetic surface facing the front-surface-side conductive foil 907 of the photovoltaic element 1, which was a material to be treated.

Then, the overlapping portion between the front-surface-side conductive foil 907 of the photovoltaic element 1 and the back-surface-side conductive foil 909 of the photovoltaic element 2, which was pressed by the presser jig, was irradiated with laser light to carry out welding and mechanically and electrically connect the elements to each other. Reference numeral 910 designates a welding point. As the laser for providing a high energy enough to weld a metal, it is possible to use a YAG laser, a phosphate glass laser, a silicate glass laser, or a $CO_2$-laser-excited far infrared laser. In particular, the YAG laser has excellent characteristics, such as its capability of transmitting laser light through optical fibers to enable treatment at a position remote from the laser oscillator, and enables the welding condition to be changed by the selection of the optical fibers and an outgoing unit. Another excellent characteristic of this laser is its capability of dividing a laser light into 2 to about 10 beams.

In this example the YAG laser was used to execute welding under the following conditions: outgoing energy: 6J; pulse width: 5 ms; laser diameter: 0.6 mm; number of welding points: 12.

The method of supplying the magnetic tape as the non-adhering medium 913 according to this example is described with reference to FIG. 20. In this figure, reference numeral 920 indicates a magnetic tape housed in a cassette, 921 a reel around which a magnetic tape irradiated with laser light is wound, and 922 a presser member for pressing the magnetic tape 913 against a junction portion between the front-surface-side conductive foil 907 of the photovoltaic element 1 and the back-surface-side conductive foil 909 of the photovoltaic element 2, which are materials to be treated. A transfer means (not shown in the drawings) is used to transfer to a laser treatment position the front-surface-side and back-surface-side conductive foils 907 and 909 of the photovoltaic elements 1 and 2, respectively. Then, the presser jig 922 presses the magnetic tape 913 against the junction portion between the front-surface-side conductive foil 907 of the photovoltaic element 1 and the back-surface-side conductive foil 909 of the photovoltaic element 2. Subsequently, the junction portion is irradiated with laser light 930 to carry out a predetermined laser treatment.

The portion of the magnetic tape 913 irradiated with laser light melts and is evaporated by the heat generated by welding. Furthermore, since a magnetic substance having a surface roughness of 5 nm to 20 nm in mean square is coated or deposited on the surface of the magnetic tape 913 closely contacting the front-surface-side conductive foil 907 of the photovoltaic element 1, after welding, the magnetic tape 913 can be removed by simply releasing the presser jig. The magnetic tape 913 may adhere to the front-surface-side conductive foil 907 in some cases, but can be easily removed by applying force to slightly release the tape from the foil (not shown in the drawings).

Subsequently, the magnetic tape 913 is fed by 3 cm to be wound around the winding reel 921, and an unused magnetic tape is supplied from the magnetic tape cassette 920 to complete preparations for the subsequent laser treatment. The treated photovoltaic elements 1 and 2 are conveyed out by a transfer means (not shown in the drawings) immediately after laser treatment.

The electric resistance of the laser welded portion was measured to be 0.013 Ω. With respect to the performance of the photovoltaic element 900, the effective area was 809.0 cm$^2$, the generated current was 5.38 A, the generated voltage was 1.2 V, and the generated power was 6.45 W, therefore the resistance loss of the laser welded portion was 0.9 mW, which is only 0.015% of the generated electric power of 6.45 W. In addition, the tensile strength of the laser welded portion was measured to be in a range of 8 kg to 15 kg.

In this example, with respect to the time required for laser welding, 2.0 seconds were required to feed-in and position the photovoltaic elements 1 and 2, 3.5 seconds were required for welding (including the movement of the laser beam outgoing tip), and 1.0 second was required for feed-out of the treated elements. Thus, the connection of the two photovoltaic elements was completed in 6.5 seconds.

That is, this example can provide a method of connecting photovoltaic elements in series that enables laser welding at a lower energy than the conventional techniques, enables high speed treatment, and avoids appearance problems while preventing post-process problems.

The present invention minimizes the time required for heating when executed to connect a group of photovoltaic elements, thereby preventing the components of the photovoltaic elements, such as the semiconductor layer and conductive adhesive, from being degraded by wide-ranging heating.

In addition, in the present invention, each operation can be completed in a short time to enable mass production.

Furthermore, the present invention eliminates the needs for solder to avoid reduction of the production yield due to solder residues and to avoid the adverse effect of remaining fluxes on a covering material.

In addition, the present invention teaches using color ink or film to easily increase the laser absorption efficiency, thereby providing an inexpensive photovoltaic element production method having a high production efficiency.

Furthermore, in the method of placing the nonadhering medium on the surface to be irradiated with laser light of the material to be treated, and irradiating the non-adhering medium with laser light while holding the non-adhering medium and the material, laser treatment can be stably executed because the reflectance is determined depending on the physical properties of the placed material (non-adhering medium). In addition, the treatment can be carried out while holding the non-adhering medium and the material to be treated, thereby enabling stable close contact therebetween, and thus stable laser treatment. Moreover, high speed treatment is possible because of placing only the non-adhering medium.

What is claimed is:

1. A non-contact treatment method using an energy supply means for supplying energy, which comprises placing a non-adhering medium capable of absorbing the energy on a material to be treated, and irradiating the non-adhering medium with the energy, wherein the treatment is cutting or welding and the cutting or welding is carried out on a back side of the non-adhering medium capable of absorbing the energy, which said back side is opposite to a beam irradiation side.

2. A non-contact treatment method according to claim 1, wherein a surface of the non-adhering medium closely contacting the material to be treated has a surface roughness of 0.1 nm to 5,000 nm in root mean square.

3. A non-contact treatment method according to claim 1, wherein the non-adhering medium has at least a polymer film.

4. A non-contact treatment method according to claim 1, wherein the non-adhering medium is a magnetic tape.

5. A non-contact treatment method according to claim 4, wherein a magnetic surface of the magnetic tape is closely contacted with the material to be treated.

6. A non contact treatment method according to claim 1, wherein the non-adhering medium absorbs 10% or more of a light having a wavelength of 0.4 μm to 2.0 μm.

7. A non-contact treatment method according to claim 1, wherein the energy is light, heat, or electromagnetic waves.

8. A non-contact treatment method according to claim 1, wherein the non-adhering medium is irradiated with the energy while pressing the non-adhering medium against the material to be treated.

9. A non-contact treatment method according to claim 1, wherein the non-adhering medium is removed by irradiation of the energy.

10. A non-contact treatment method according to claim 1, wherein the non-adhering medium is removed after the energy irradiation.

11. A non-contact treatment method according to claim 1, wherein the non-adhering medium is supplied from a roll of the non-adhering medium, and after the energy irradiation, is wound up.

12. A non-contact treatment method according to claim 1, wherein the material to be treated is an electrode of an electric part.

13. A non-contact treatment method according to claim 1, wherein the material to be treated is an electrode of a photovoltaic element.

14. A non-contact treatment method according to claim 1, wherein the material to be treated is a material having a high reflectance with respect to energy irradiation.

* * * * *

UNITED STATES PATENT AND TRADEMARK OFFICE
CERTIFICATE OF CORRECTION

PATENT NO. : 6,984,804 B2
APPLICATION NO. : 09/840893
DATED : January 10, 2006
INVENTOR(S) : Yoshifumi Takeyama et al.

It is certified that error appears in the above-identified patent and that said Letters Patent is hereby corrected as shown below:

COVER [62] RELATED U.S. APPLICATION DATA

"1998." should read --1998, now Pat. No. 6,388,187.--.

COLUMN 1

Line 4, "1998." should read --1998, now Pat. No. 6,388,187.--.

COLUMN 8

Line 23, "Medium capable of absorbing at least 10% or more of laser" should read -- Medium Capable of Absorbing at Least 10% or More of Laser--.

COLUMN 9

Line 47, "polyethyleneterephthalate)" should read --(polyethyleneterephthalate)--.

COLUMN 10

Line 23, "(LUMIRROR" should read --LUMIRROR--.

COLUMN 11

Line 29, "material" should read --materials--.

COLUMN 12

Line 22, "sufficiently" should read --sufficient--.

COLUMN 13

Line 54, "strong-acid" should read --strong acid--.

COLUMN 15

Line 35, "remains" should read --remain--; and
Line 65, "layers this" should read --layers in this--.

UNITED STATES PATENT AND TRADEMARK OFFICE
CERTIFICATE OF CORRECTION

PATENT NO. : 6,984,804 B2
APPLICATION NO. : 09/840893
DATED : January 10, 2006
INVENTOR(S) : Yoshifumi Takeyama et al.

It is certified that error appears in the above-identified patent and that said Letters Patent is hereby corrected as shown below:

<u>COLUMN 18</u>

Line 15, "was 6.0J ," should read --was 6.0J,--.

<u>COLUMN 23</u>

Line 46, "backsurface-side" should read --back-surface-side--; and
Line 61, "used" should read --using--.

<u>COLUMN 25</u>

Line 34, "needs" should read --need--.

<u>COLUMN 26</u>

Line 24, "non contact" should read --non-contact--; and
Line 41, "medium, and" should read --medium and,--.

Signed and Sealed this

Twenty-fifth Day of July, 2006

JON W. DUDAS
*Director of the United States Patent and Trademark Office*

UNITED STATES PATENT AND TRADEMARK OFFICE
CERTIFICATE OF CORRECTION

PATENT NO.         : 6,984,804 B2                                                Page 1 of 1
APPLICATION NO. : 09/840893
DATED              : January 10, 2006
INVENTOR(S)        : Yoshifumi Takeyama et al.

It is certified that error appears in the above-identified patent and that said Letters Patent is hereby corrected as shown below:

COVER [75] INVENTORS

"Yoshimitsu Hayashi, Yokohama (JP);" should read --Yoshimitsu Hayashi, Yokosuka (JP);--.

COVER [56] FOREIGN PATENT DOCUMENTS

"JP   30-5639   1/1991" should read --JP   3-005639   1/1991--.

Signed and Sealed this

Twenty-second Day of August, 2006

JON W. DUDAS
*Director of the United States Patent and Trademark Office*